United States Patent
Lim et al.

(10) Patent No.: US 9,627,338 B2
(45) Date of Patent: Apr. 18, 2017

(54) SEMICONDUCTOR DEVICE AND METHOD OF FORMING ULTRA HIGH DENSITY EMBEDDED SEMICONDUCTOR DIE PACKAGE

(71) Applicant: STATS ChipPAC, Ltd., Singapore (SG)

(72) Inventors: See Chian Lim, Singapore (SG); Teck Tiong Tan, Singapore (SG); Yung Kuan Hsiao, Singapore (SG); Ching Meng Fang, Singapore (SG); Yoke Hor Phua, Singapore (SG); Bartholomew Liao, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 14 days.

(21) Appl. No.: 14/187,014

(22) Filed: Feb. 21, 2014

(65) Prior Publication Data
US 2014/0252641 A1 Sep. 11, 2014

Related U.S. Application Data

(60) Provisional application No. 61/773,308, filed on Mar. 6, 2013, provisional application No. 61/835,321, filed on Jun. 14, 2013.

(51) Int. Cl.
*H01L 21/56* (2006.01)
*H01L 23/00* (2006.01)
(Continued)

(52) U.S. Cl.
CPC .............. *H01L 24/11* (2013.01); *H01L 21/56* (2013.01); *H01L 23/145* (2013.01);
(Continued)

(58) Field of Classification Search
CPC ... H01L 23/295; H01L 21/56; H01L 23/5389; H01L 23/145; H01L 23/49822; H01L 21/568; H01L 23/3128; H01L 23/562
See application file for complete search history.

(56) References Cited

U.S. PATENT DOCUMENTS 4,931,853 A * 6/1990 Ohuchi ............ G06K 19/07745
257/679
6,271,469 B1 * 8/2001 Ma .......................... H01L 21/56
174/521

(Continued)

OTHER PUBLICATIONS

"Trench Wiring Materials and Process Technologies for FOWLP", Yole Developpement, 2012, pp. 1-18.

*Primary Examiner* — Jarrett Stark
(74) *Attorney, Agent, or Firm* — Robert D. Atkins; Patent Law Group: Atkins and Associates, P.C.

(57) ABSTRACT

A semiconductor device has a plurality of semiconductor die. A first prefabricated insulating film is disposed over the semiconductor die. A conductive layer is formed over the first prefabricated insulating film. An interconnect structure is formed over the semiconductor die and first prefabricated insulating film. The first prefabricated insulating film is laminated over the semiconductor die. The first prefabricated insulating film includes glass cloth, glass fiber, or glass fillers. The semiconductor die is embedded within the first prefabricated insulating film with the first prefabricated insulating film covering first and side surfaces of the semiconductor die. The interconnect structure is formed over a second surface of the semiconductor die opposite the first surface. A portion of the first prefabricated insulating film is removed after disposing the first prefabricated insulating film over the semiconductor die. A second prefabricated insulating film is disposed over the first prefabricated insulating film.

24 Claims, 27 Drawing Sheets

(51) Int. Cl.
  *H01L 23/14*    (2006.01)
  *H01L 23/498*   (2006.01)
  *H01L 23/538*   (2006.01)
  *H01L 23/29*    (2006.01)
  *H01L 23/31*    (2006.01)

(52) U.S. Cl.
  CPC ........ *H01L 23/295* (2013.01); *H01L 23/3135* (2013.01); *H01L 23/49822* (2013.01); *H01L 23/5389* (2013.01); *H01L 24/19* (2013.01); *H01L 24/20* (2013.01); *H01L 24/96* (2013.01); *H01L 24/97* (2013.01); *H01L 21/568* (2013.01); *H01L 23/3128* (2013.01); *H01L 23/562* (2013.01); *H01L 2224/04105* (2013.01); *H01L 2224/12105* (2013.01); *H01L 2224/96* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/351* (2013.01); *H01L 2924/3511* (2013.01)

(56) References Cited

U.S. PATENT DOCUMENTS

| | | | |
|---|---|---|---|
| 6,586,822 B1* | 7/2003 | Vu | H01L 23/532 257/678 |
| 2002/0117762 A1* | 8/2002 | Ikegami | H01L 23/3157 257/782 |
| 2004/0130024 A1* | 7/2004 | Tsukahara | G06K 19/07745 257/737 |
| 2011/0139224 A1* | 6/2011 | Krajewski | H01L 31/048 136/251 |
| 2011/0198762 A1* | 8/2011 | Scanlan | H01L 23/528 257/793 |
| 2012/0032347 A1* | 2/2012 | Chang | H01L 24/96 257/777 |
| 2012/0273947 A1* | 11/2012 | Mo | H01L 23/49816 257/738 |
| 2012/0319254 A1* | 12/2012 | Kikuchi | H01L 23/5389 257/659 |
| 2013/0009325 A1* | 1/2013 | Mori | H01L 23/5389 257/774 |
| 2013/0050967 A1* | 2/2013 | Ohshima | H01L 23/49827 361/764 |
| 2013/0078770 A1* | 3/2013 | Oda | H01L 24/19 438/127 |
| 2013/0119555 A1* | 5/2013 | Sundaram | H01L 21/486 257/774 |
| 2013/0200534 A1* | 8/2013 | Shiobara | H01L 21/78 257/787 |
| 2013/0219712 A1* | 8/2013 | Suzuki | H05K 3/284 29/841 |
| 2014/0252641 A1* | 9/2014 | Lim | H01L 24/11 257/773 |

* cited by examiner

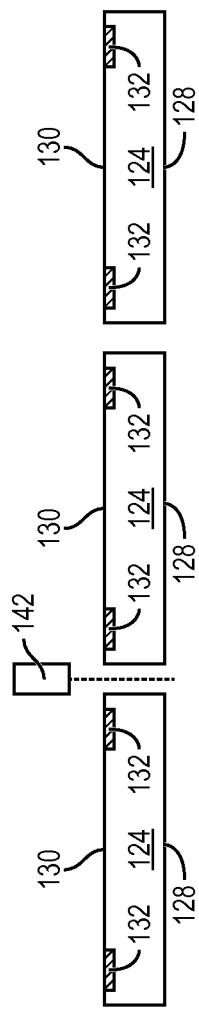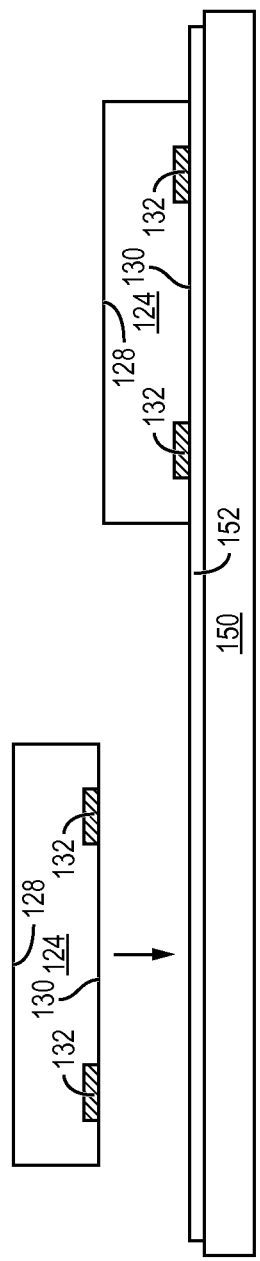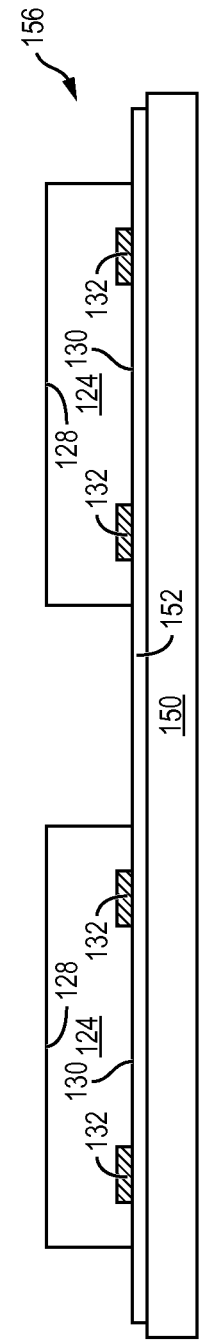

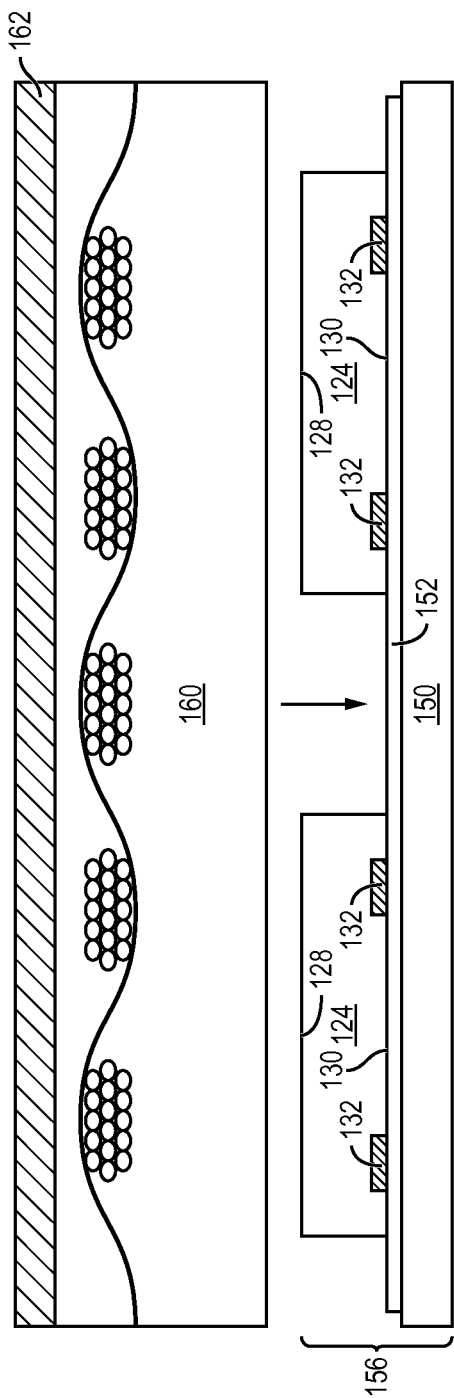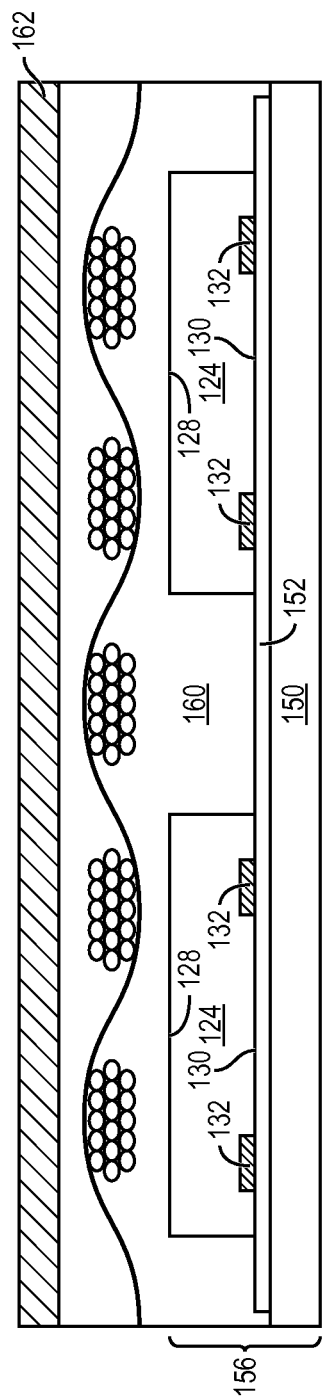

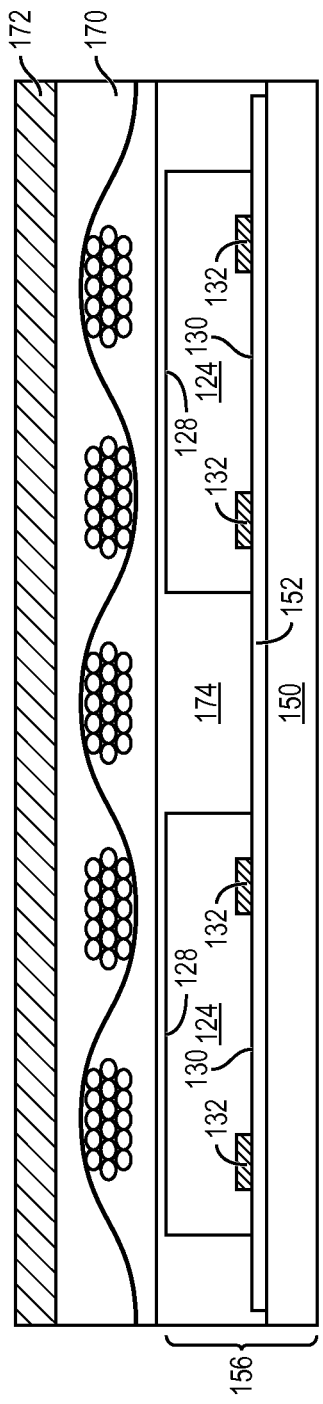
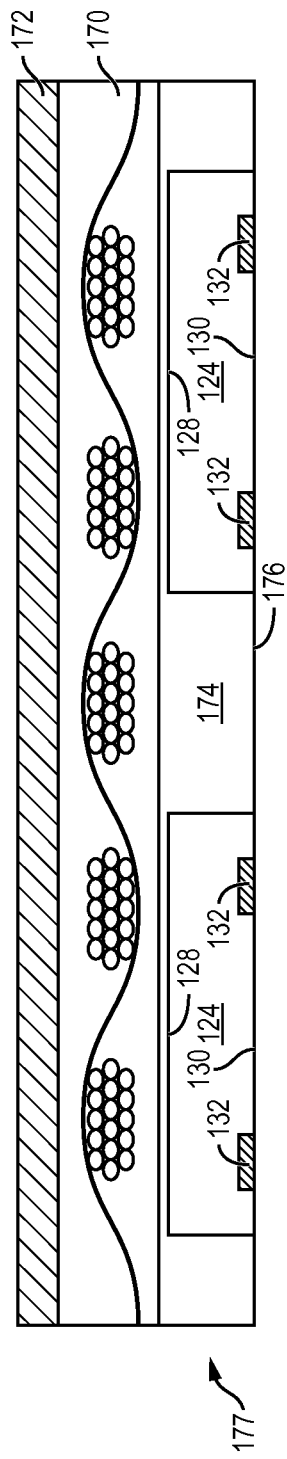
FIG. 5b
FIG. 5c

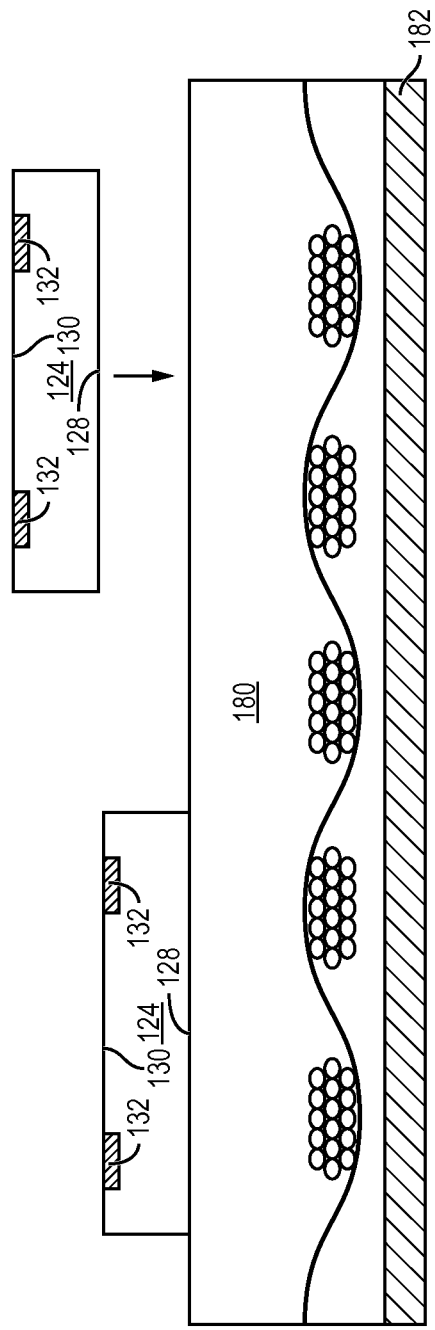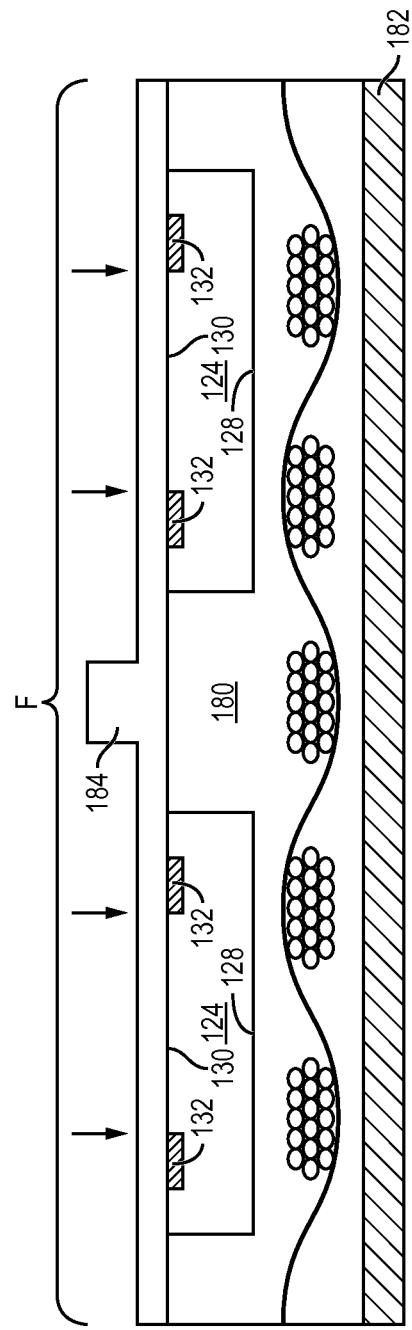

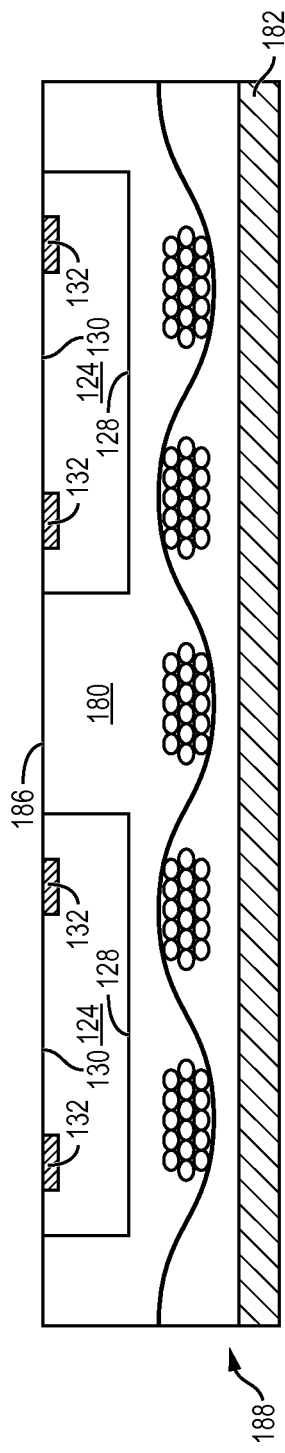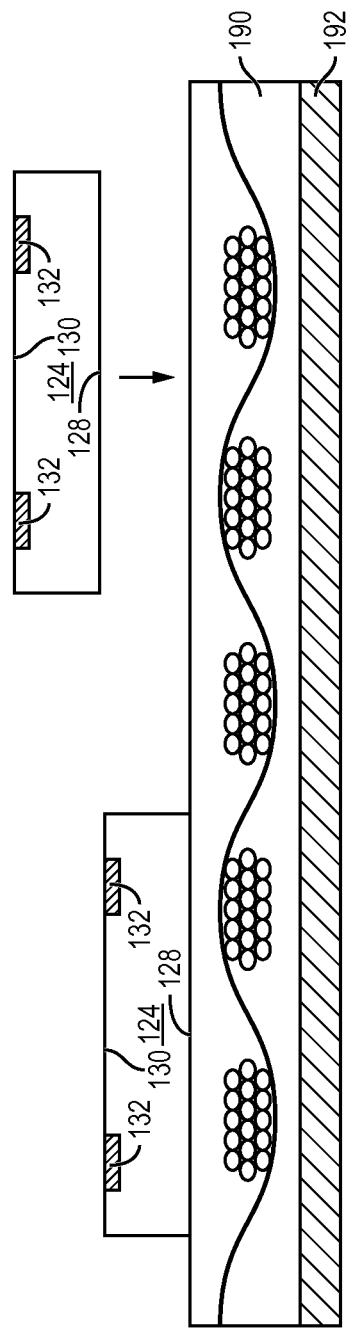

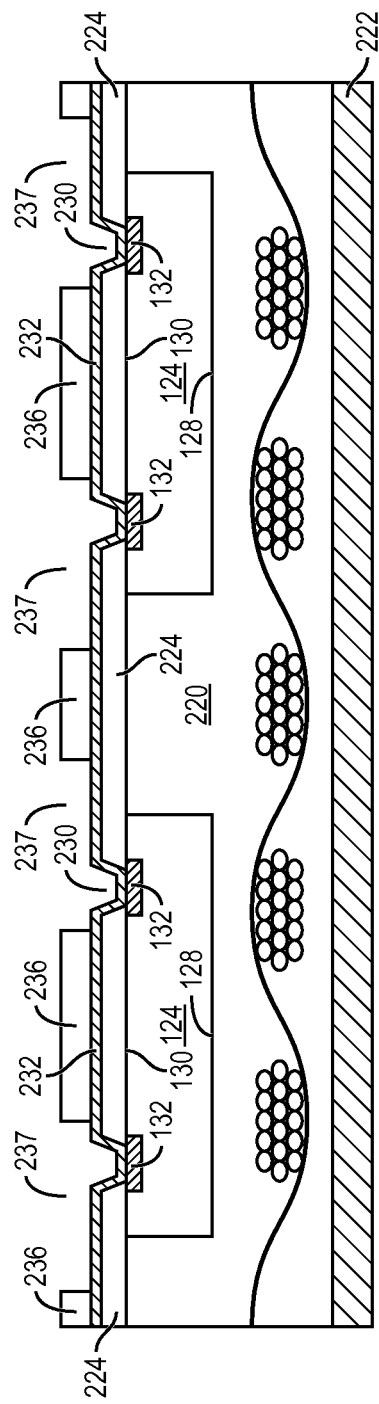
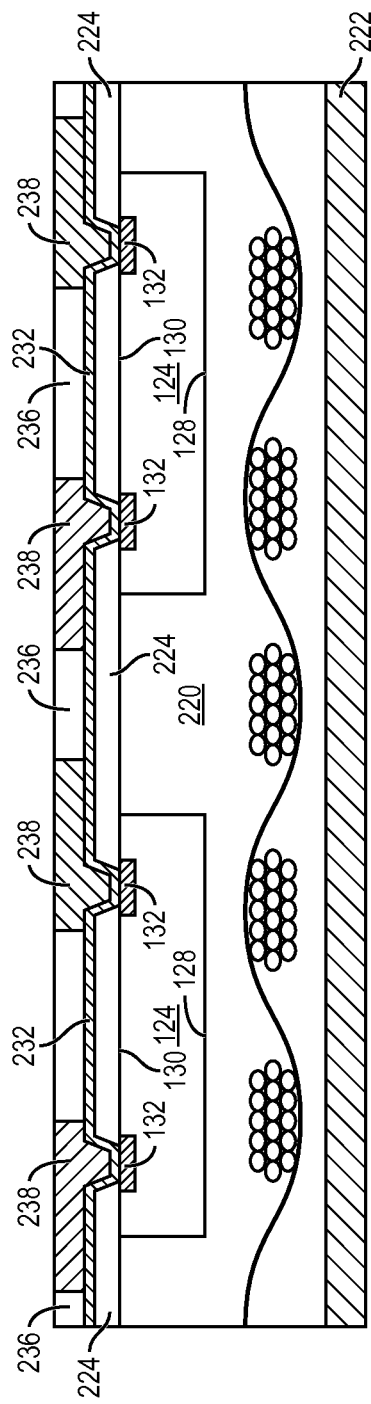
FIG. 10d
FIG. 10e

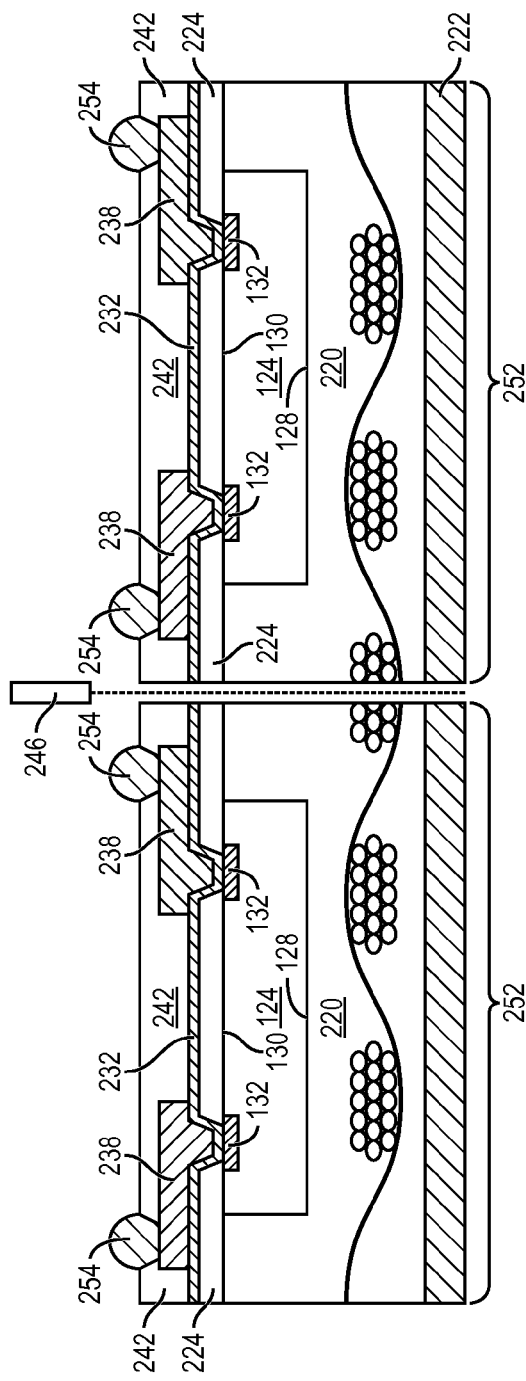
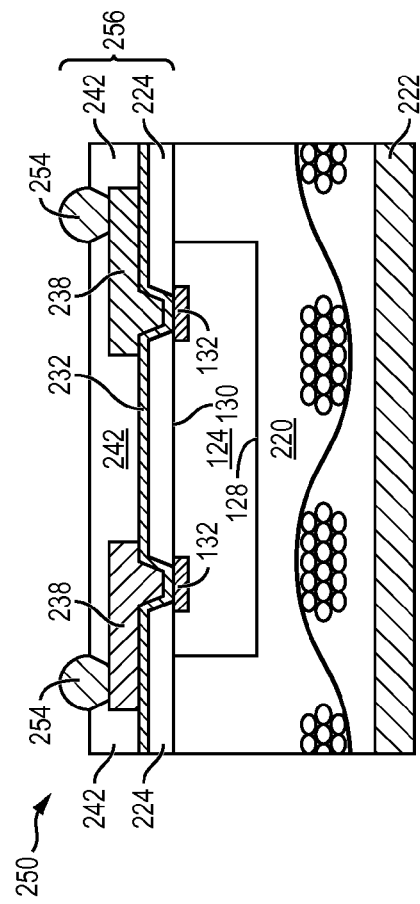
FIG. 10j
FIG. 10k

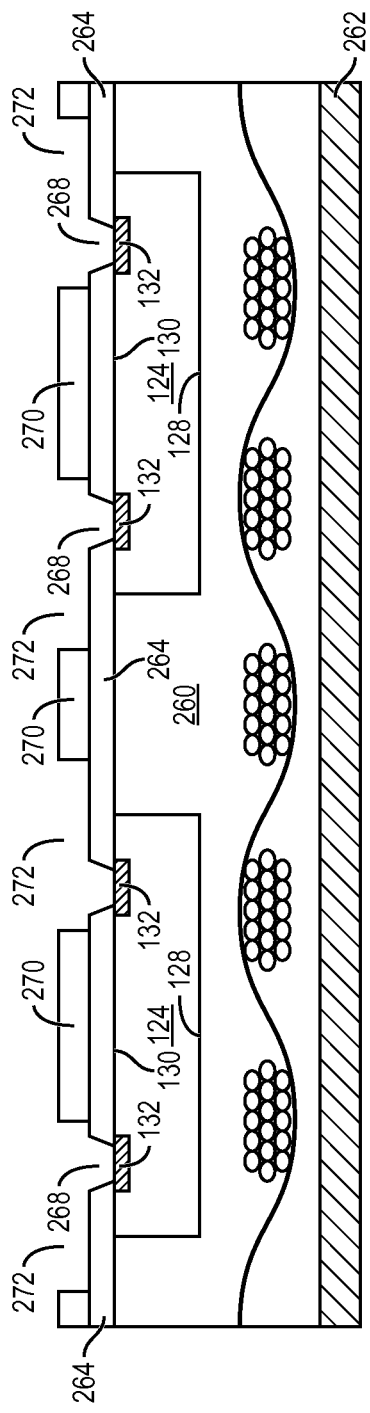
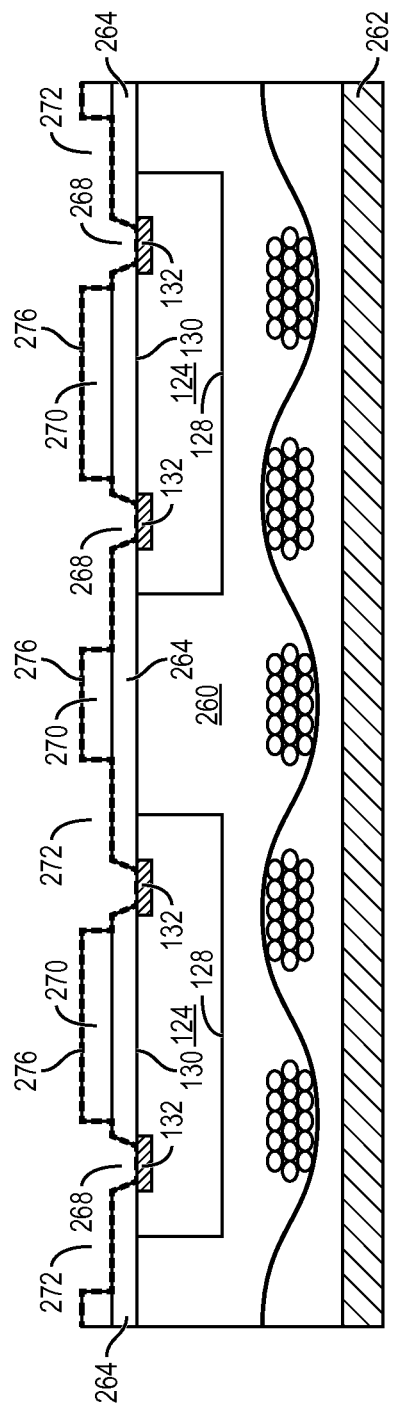
*FIG. 11c*
*FIG. 11d*

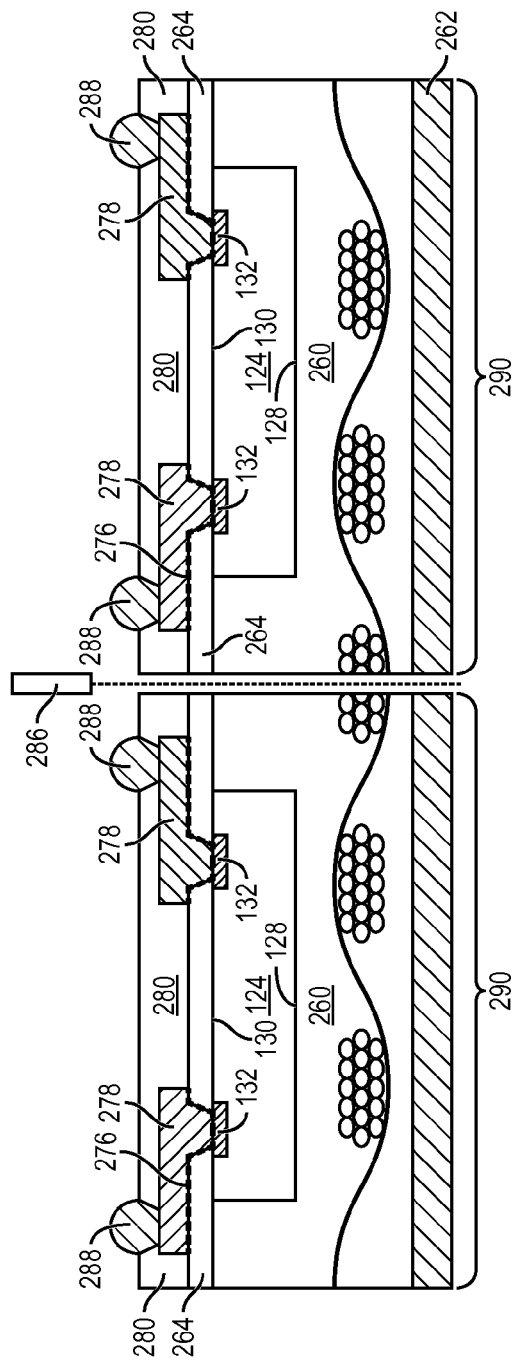
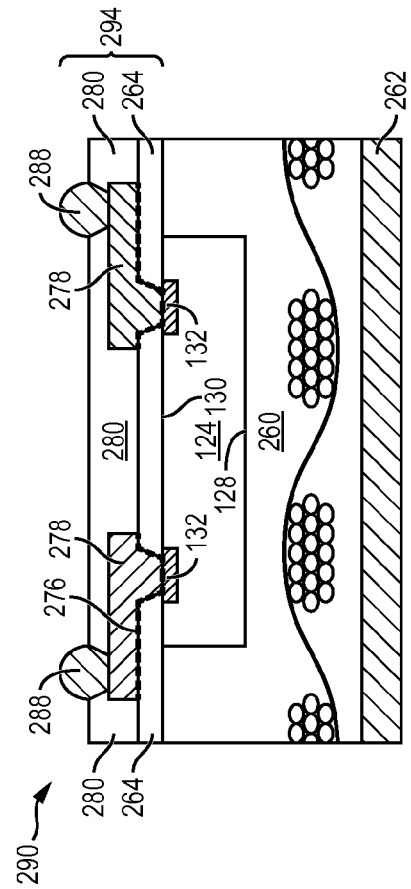
FIG. 11i
FIG. 11j

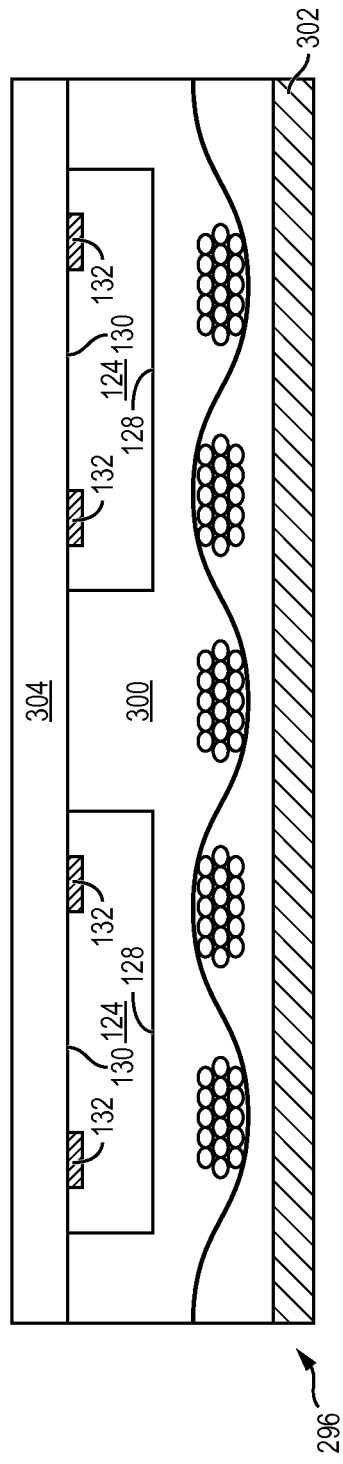
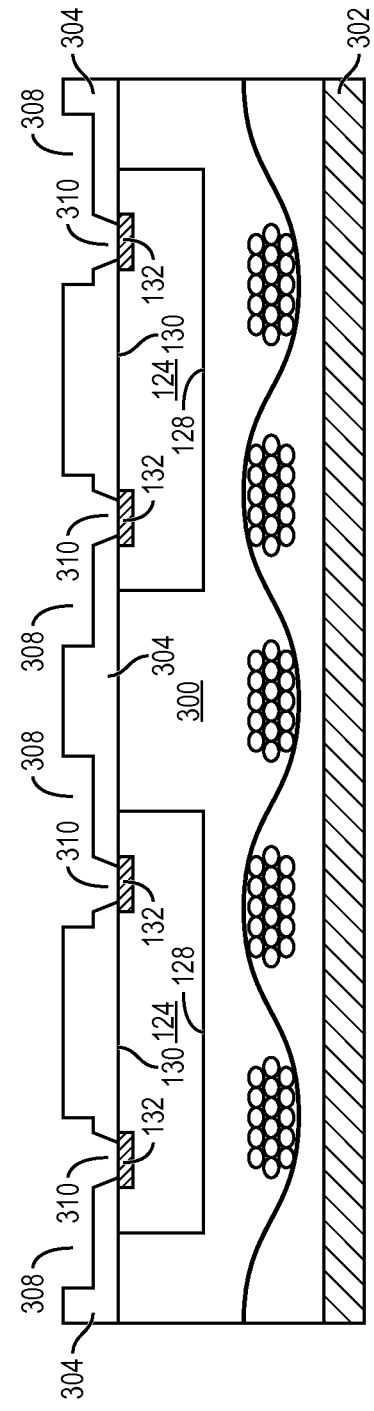
FIG. 12a
FIG. 12b

SEMICONDUCTOR DEVICE AND METHOD OF FORMING ULTRA HIGH DENSITY EMBEDDED SEMICONDUCTOR DIE PACKAGE

CLAIM TO DOMESTIC PRIORITY

The present application claims the benefit of U.S. Provisional Application No. 61/773,308, filed Mar. 6, 2013 and U.S. Provisional Application No. 61/835,321, filed Jun. 14, 2013, which applications are incorporated herein by reference.

FIELD OF THE INVENTION

The present invention relates in general to semiconductor devices and, more particularly, to a semiconductor device and method of forming an ultra-high density (UHD) embedded wafer level ball grid array (eWLB) semiconductor die package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a conventional fan-out semiconductor package, semiconductor die are embedded in an encapsulant or insulating layer over a temporary carrier as a reconfigured wafer. For example, encapsulant can be deposited over the semiconductor die and carrier by mold injection. Similarly, insulating layers may be built up or formed over the carrier to embed the semiconductor die. Thereafter, the carrier is removed to expose the semiconductor die. A build-up interconnect structure, comprising one or more conductive layers, is formed over the exposed semiconductor die for electrical redistribution.

The semiconductor die is known to vertically and laterally shift during encapsulation, particularly during mold injection, which can cause misalignment of the build-up interconnect structure. Further, a mismatch between the coefficient of thermal expansion (CTE) of the encapsulant and carrier can cause warpage in the reconfigured wafer. A CTE difference between the encapsulant and semiconductor die can cause delamination due to thermal stress. Forming an insulating layer over the semiconductor die can attract foreign materials, generate wasteful byproducts, and requires excess manufacturing steps with increased cost. Forming an insulating layer over a semiconductor die can further result in roughened surfaces around the insulating layer. The roughened surfaces can impact adhesion between the insulating layer and additional components disposed on the insulating layer. The roughened surfaces can further impact the electrical characteristics of conductive layers formed on the insulating layer as part of the build-up interconnect structure. For example, when a conductive layer is applied over the roughened surfaces for redistribution, the interface between the insulating layer and conductive layer lacks linearity, i.e., contains imperfections along the interface due to the roughened surfaces of the insulating layer. Imperfections along the interface can cause higher resistance, poorer transmission quality, and degrade redistribution performance across the conductive layer.

SUMMARY OF THE INVENTION

A need exists to increase the density of embedded semiconductor die packages, enhance structural characteristics, and improve electrical redistribution while reducing manufacturing steps and cost. Accordingly, in one embodiment, the present invention is a method of making a semiconductor device comprising the steps of providing a plurality of semiconductor die, disposing a first prefabricated insulating film over the semiconductor die, disposing a conductive layer over the first prefabricated insulating film, and forming an interconnect structure over the semiconductor die and first prefabricated insulating film.

In another embodiment, the present invention is a method of making a semiconductor device comprising the steps of providing a plurality of semiconductor die, providing a first insulating film, disposing the semiconductor die within the first insulating film, and forming an interconnect structure over the semiconductor die.

In another embodiment, the present invention is a method of making a semiconductor device comprising the steps of providing a semiconductor die, providing a first insulating film, and embedding the semiconductor die within the first insulating film.

In another embodiment, the present invention is a semiconductor device comprising a first insulating film. A semiconductor die is embedded within the first insulating film.

BRIEF DESCRIPTION OF THE DRAWINGS

FIGS. 2a-2d illustrate a semiconductor wafer with a plurality of semiconductor die separated by a saw street including testing of the semiconductor die in FIG. 2c;

FIGS. 3a-3b illustrate a process of mounting a plurality of semiconductor die to a carrier;

FIGS. 4a-4c illustrate a process of disposing an insulating film over a semiconductor die using a carrier;

FIGS. 5a-5c illustrate another process of disposing an insulating film over a semiconductor die using a carrier;

FIGS. 6a-6c illustrate a process of disposing an insulating film over a semiconductor die without using a carrier;

FIGS. 7a-7c illustrate another process of disposing an insulating film over a semiconductor die without using a carrier;

FIGS. 10a-10k illustrate a process of forming a build-up interconnect structure over a reconfigured wafer similar to the reconfigured wafers described in FIG. 4c, 5c, 6c, 7c, 8c, or 9;

FIGS. 11a-11j illustrate another process of forming a build-up interconnect structure over a reconfigured wafer similar to the reconfigured wafers described in FIG. 4c, 5c, 6c, 7c, 8c, or 9; and FIGS. 12a-12j illustrate another process of forming a build-up interconnect structure over a reconfigured wafer similar to the reconfigured wafers described in FIG. 4c, 5c, 6c, 7c, 8c, or 9.

DETAILED DESCRIPTION OF THE DRAWINGS

Figure 1:
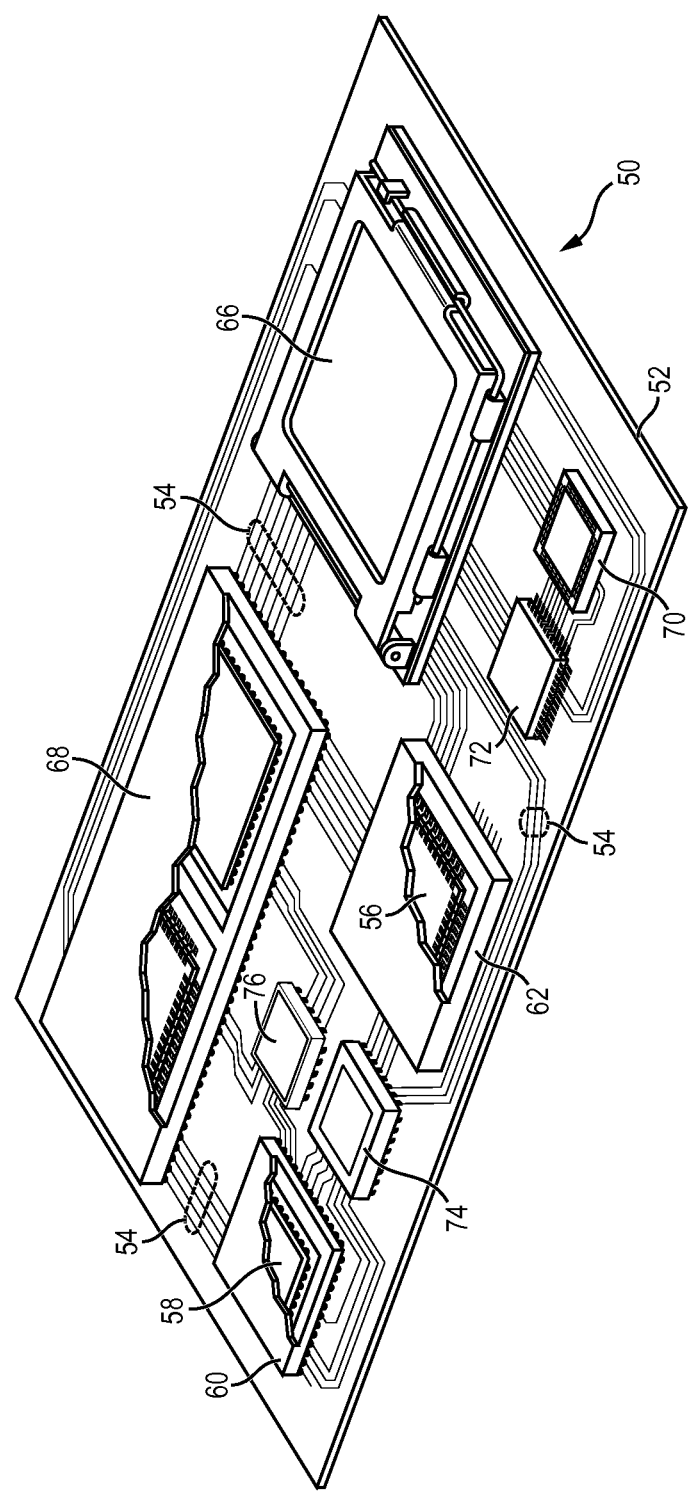
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. eWLB 74 is a fan-out wafer level package and WLCSP 76 is a fan-in wafer level package. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
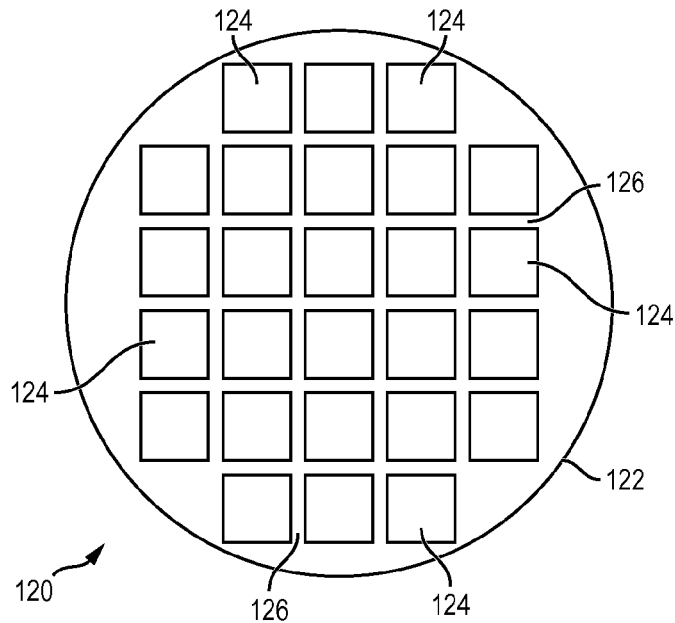

FIG. 2a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 2B:
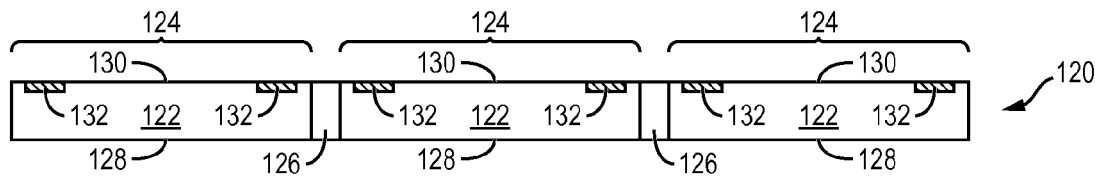

FIG. 2b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), or silver (Ag) or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet (UV) light, or metallurgical microscope. Semiconductor wafer 120 is inspected for structural characteristics including warpage, thickness variation, surface particulates, irregularities, cracks, delamination, and discoloration.

Figure 2C:
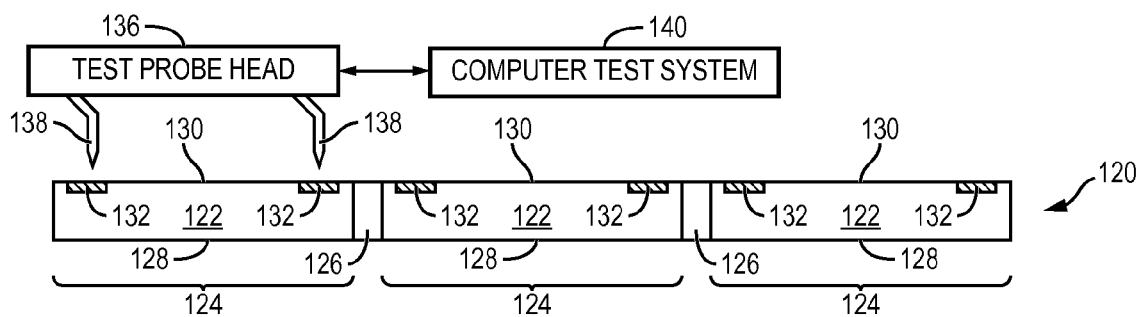

The active and passive components within semiconductor die 124 undergo testing at the wafer level for electrical performance and circuit function. Each semiconductor die 124 is tested for functionality and electrical parameters, as shown in FIG. 2c, using a probe 138 or other testing device. Test probe head 136 includes a plurality of probes 138. Probes 138 are used to make electrical contact with nodes or contact pads 132 on each semiconductor die 124 and provide electrical stimuli to the contact pads. Semiconductor die 124 responds to the electrical stimuli, which is measured by computer test system 140 and compared to an expected response to test functionality of the semiconductor die 124. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post singulation.

FIGS. 3a-3b illustrate, in relation to FIGS. 1 and 2a-2d, a process of mounting a semiconductor die to a carrier. FIG. 3a shows a cross-sectional view of a portion of a carrier or carrier frame 150. A carrier tape 152 is formed over carrier 150. Carrier 150 and/or carrier tape 152 contain sacrificial base material such as silicon, polymer, beryllium oxide, glass, or other suitable low-cost, rigid material for structural support.

Semiconductor die 124 from FIG. 2d are mounted to carrier tape 152 and carrier 150 using, for example, a pick and place operation with active surface 130 oriented toward carrier 150. FIG. 3b shows semiconductor die 124 mounted to carrier tape 152 and carrier 150 with an adhesive layer as a reconstituted or reconfigured wafer 156.

Carrier 150 can be a round or rectangular panel (greater than 300 mm) with capacity for multiple semiconductor die 124. Carrier 150 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of semiconductor die 124 or size of semiconductor wafer 120. That is, carrier 150 has a fixed or standardized size, which can accommodate various size semiconductor die 124 singulated from one or more semiconductor wafers 120. In one embodiment, carrier 150 is circular with a diameter of 330 mm. In another embodiment, carrier 150 is rectangular with a width of 560 mm and length of 600 mm. Semiconductor die 124 may have dimensions of 10 mm by 10 mm, which are placed on the standardized carrier 150. Alternatively, semiconductor die 124 may have dimensions of 20 mm by 20 mm, which are placed on the same standardized carrier 150. Accordingly, standardized carrier 150 can handle any size semiconductor die 124, which allows subsequent semiconductor processing equipment to be standardized to a common carrier, i.e., independent of die size or incoming wafer size. Semiconductor packaging equipment can be designed and configured for the standard carrier 150 using a common set of processing tools, equipment, and bill of materials to process any semiconductor die size from any incoming wafer size. The common or standardized carrier 150 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Reconstituted wafer 156 can be processed into many types of semiconductor packages, including flipchip packages, eWLB, WLCSP, reconstituted or embedded wafer level chip scale packages (eWLCSP), fan-out WLCSP, three dimensional (3D) packages, such as package-on-package (PoP), or other semiconductor packages. Reconstituted wafer 156 is configured according to the specifications of the resulting semiconductor package. In one embodiment, semiconductor die 124 are placed on carrier 150 in a high-density arrangement, i.e., 300 micrometers (μm) apart or less, for processing fan-in devices. In another embodiment, semiconductor die 124 are separated by a distance of 50 μm on carrier 150. The distance between semiconductor die 124 on carrier 150 is optimized for manufacturing the semiconductor packages at the lowest unit cost. The larger surface area of carrier 150 accommodates more semiconductor die 124 and lowers manufacturing cost as more semiconductor die 124 are processed per reconstituted wafer 156. The number of semiconductor die 124 mounted to carrier 150 can be greater than the number of semiconductor die 124 singulated from semiconductor wafer 120. Carrier 150 and reconstituted wafer 156 provide the flexibility to manufacture many different types of semiconductor packages using different size semiconductor die 124 from different sized semiconductor wafers 120.

Figure 4C:
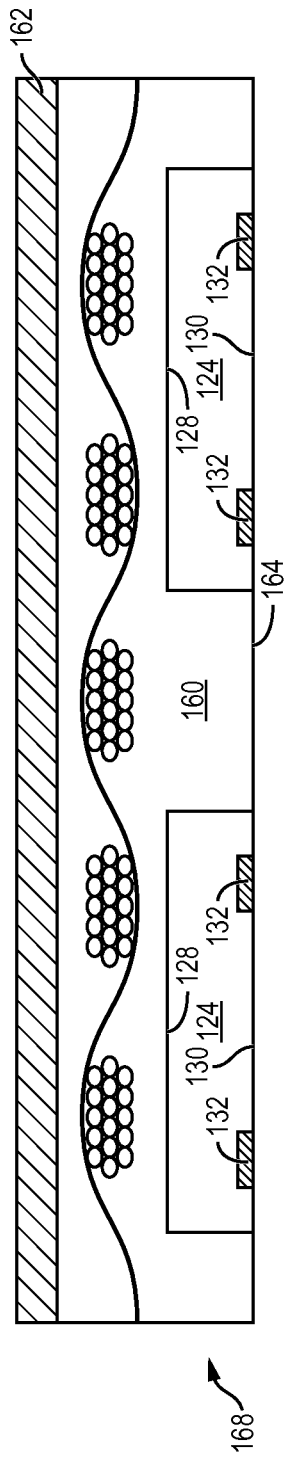

FIGS. 4a-4c illustrate, in relation to FIGS. 1, 2a-2d, and 3a-3b, a process of disposing an insulating film over a semiconductor die using a carrier. FIG. 4a shows reconstituted wafer 156 from FIG. 3b including semiconductor die 124 mounted to carrier 150 with active surface 130 oriented towards carrier 150 and back surface 128 oriented away from carrier 150.

A prefabricated insulating film, sheet mold, or layer 160 is disposed over reconstituted wafer 156. Insulating film 160 is a thin reinforced laminating insulating film, sheet mold, or layer containing one or more glass fibers, glass fillers, or glass cloth. In some embodiments, insulating film 160 includes epoxy, epoxy resin, polymeric materials, thermoset plastic laminate, or other non-conductive materials. In some embodiments, insulating film 160 is a multilayered film including a plurality of resin layers, polyester film layers, and polypropylene film layers.

A conductive layer, thin copper film, or copper foil 162 is disposed on a surface of insulating film 160 using PVD, CVD, electrolytic plating, electroless plating process, or other suitable metal deposition process. Conductive layer 162 can be one or more layers of Al, Cu, Sn, Ni, Au, Ag, or other suitable electrically conductive material. Alternatively, conductive layer 162 is disposed separately over a temporary transfer film using PVD, CVD, electrolytic plating, electroless plating process, or other suitable metal deposition process. Conductive layer 162 and temporary transfer film is then laminated over a surface of insulating film 160 followed by removal of the temporary transfer film leaving conductive layer 162 disposed on the surface of insulating film 160. In some embodiments, the thickness of conductive layer 162 ranges from 0.10 μm to 5 μm such that conductive layer 162 is a very thin film structure which contributes to the formation of a semiconductor package with reduced thickness. Conductive layer 162 provides additional stiffness and contributes to the structural stability of insulating film 160. In some embodiments, conductive layer 162 provides electrical redistribution over back surface 128 of semiconductor die 124. In other words, semiconductor die 124 may be electrically connected to conductive layer 162 through subsequent build up structures, bond wires, or interconnect structures formed through insulating film 160 such as conductive vias.

In FIG. 4a, a combination of vacuum, heat, and pressure is applied to insulating film 160 in order to facilitate the laminating of insulating film 160 over semiconductor die 124 and carrier 150, thereby embedding or encapsulating semiconductor die 124 within insulating film 160. In some embodiments, insulating film 160 is laminated on carrier 150 and semiconductor die 124 by vacuum lamination using, e.g., a vacuum hot press, followed by the introduction of heat or heated air in order to cure insulating film 160. In some embodiments, semiconductor die 124 and carrier 150 undergo surface treatment and pre-drying prior to application of insulating film 160. FIG. 4b shows semiconductor die 124 embedded within insulating film 160 over carrier 150. Insulating film 160 covers side surfaces and back surface 128 of semiconductor die 124 to secure semiconductor die 124. In some embodiments, a portion of insulating film 160 is removed after embedding the semiconductor die 124 within insulating film 160. In some embodiments, insulating film 160 is disposed over semiconductor die 124 using a chase mold, granular mold, or vacuum, heat, and compression mold.

In FIG. 4c, carrier 150 is removed by chemical etching, mechanical peeling, chemical mechanical planarization (CMP), mechanical grinding, thermal bake, UV light, laser scanning, or wet stripping to expose active surface 130 of semiconductor die 124. In one embodiment, as shown in FIG. 4c, active surface 130 of semiconductor die 124 is coplanar with a surface 164 of insulating film 160. Semiconductor die 124 embedded within insulating film 160 constitutes a reconfigured wafer 168. Conductive layer 162 is disposed over a surface of insulating film 160 opposite semiconductor die 124. Active surface 130 of semiconductor die 124 is exposed for electrical redistribution.

Reconfigured wafer 168, comprising semiconductor die 124, insulating film 160, and conductive layer 162, embeds and supports semiconductor die 124 with reduced process steps. Insulating film 160, as a prefabricated component laminated over semiconductor die 124, does not require being formed or built up over the semiconductor die 124. Insulating film 160 reduces process steps because insulating film 160 and additional insulating films similar to insulating film 160 can be processed and applied continuously and efficiently over multiple semiconductor die structures such as reconstituted wafer 156. Insulating film 160 is not susceptible to complications arising from the application of conventional insulating materials. For example, as a prefabricated structure, insulating film 160 reduces the formation of voids, roughness, and imperfections generated by conventional liquid coating processes. Insulating film 160 reduces the likelihood of warpage in a semiconductor package. Insulating film 160 improves environmental conditions by, e.g., reducing solvent evaporation and the creation of wasteful byproducts typically generated with liquid insulating materials. Insulating film 160 has a reduced CTE and high insulation reliability. Insulating film 160 reduces shifting of semiconductor die 124 during subsequent processing steps. Insulating film 160 has advanced adhesive properties. Insulating film 160, reinforced with glass fibers, glass fillers, or glass cloth, combined with conductive layer 162 is a robust and secure embedding material for semiconductor die 124 and provides enhanced structural stability across the thickness of reconfigured wafer 168.

Reconfigured wafer 168 is well-suited for receiving additional semiconductor components. For example, insulating film 160 has smooth surfaces which assists with the formation of interconnect structures over insulating film 160. With smoother surfaces, the interface between insulating film 160 and conductive layers formed on insulating film 160 has reduced imperfections and is significantly more linear across the interface. For example, the interface between conductive layer 162 and insulating film 160 is more linear with reduced imperfections along the interface. A more linear interface between insulating film 160 and conductive layers disposed on insulating film 160 affords lower resistance at the interface and improvements in signal transmission.

Figure 5A:
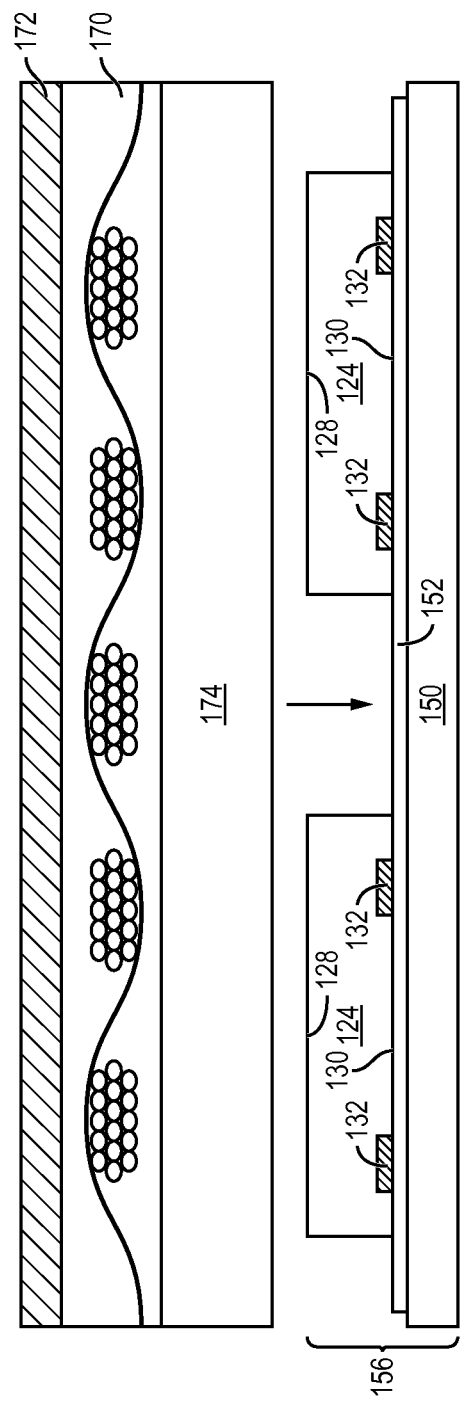

FIGS. 5a-5c illustrate, in relation to FIGS. 1, 2a-2d, and 3a-3b, another process of disposing an insulating film over a semiconductor die using a carrier similar to the process shown in FIGS. 4a-4c. FIG. 5a shows reconstituted wafer 156 from FIG. 3b including semiconductor die 124 mounted to carrier 150 with active surface 130 oriented towards carrier 150 and back surface 128 oriented away from carrier 150.

Insulating film 170 and laminating layer 174 are disposed over reconstituted wafer 156. Insulating film 170 is a thin prefabricated reinforced laminating insulating film, sheet mold, or layer containing one or more glass fibers, glass fillers, or glass cloth similar to insulating film 160. In some embodiments, insulating film 170 includes epoxy, epoxy resin, polymeric materials, thermoset plastic laminate, or other non-conductive materials. In some embodiments, insulating film 170 is a multilayered film including a plurality of resin layers, polyester film layers, and polypropylene film layers.

A conductive layer, thin copper film, or copper foil 172, similar to conductive layer 162 is disposed over insulating film 170 using PVD, CVD, electrolytic plating, electroless plating process, or other suitable metal deposition process. Conductive layer 172 can be one or more layers of Al, Cu, Sn, Ni, Au, Ag, or other suitable electrically conductive material. Alternatively, conductive layer 172 is disposed separately over a temporary transfer film using PVD, CVD, electrolytic plating, electroless plating process, or other suitable metal deposition process. Conductive layer 172 and temporary transfer film is then laminated over a surface of insulating film 170 followed by removal of the temporary transfer film leaving conductive layer 172 disposed on the surface of insulating film 170. In some embodiments, the thickness of conductive layer 172 ranges from 0.10 µm to 5 µm such that conductive layer 172 is a very thin film structure which contributes to the formation of a semiconductor package with reduced thickness. Conductive layer 172 provides additional stiffness and contributes to the structural stability of insulating film 170.

Prefabricated laminating layer 174 is disposed over insulating film 170 opposite conductive layer 172. Laminating layer 174 over insulating film 170 provides a dual reinforced layer by combination of insulating film 170 and laminating layer 174. In some embodiments, laminating layer 174 is a film layer with or without glass fibers, glass fillers, or glass cloth. In some embodiments, laminating layer 174 contains epoxy, epoxy resin, polymeric materials, thermoset plastic laminate, or other non-conductive materials. In some embodiments, laminating layer 174 is a multilayered film including a plurality of resin layers, polyester film layers, and polypropylene film layers.

In FIG. 5a, a combination of vacuum, heat, and pressure is applied to insulating film 170 and laminating layer 174 in order to facilitate the lamination of laminating layer 174 over semiconductor die 124 and carrier 150, thereby embedding semiconductor die 124 within laminating layer 174. In some embodiments, laminating layer 174 is laminated on semiconductor die 124 and carrier 150 by vacuum lamination, using, e.g., a vacuum hot press, followed by the introduction of heat or heated air in order to cure laminating layer 174. In some embodiments, semiconductor die 124 and carrier 150 undergo surface treatment and pre-drying prior to application of laminating layer 174. FIG. 5b shows semiconductor die 124 embedded within laminating layer 174 over carrier 150 with insulating film 170 and conductive layer 172 providing structural support over back surface 128 of semiconductor die 124. Laminating layer 174 covers side surfaces and back surface 128 of semiconductor die 124 to secure semiconductor die 124. In some embodiments, a portion of insulating film 170 or laminating layer 174 is removed after embedding the semiconductor die 124 within laminating layer 174.

In FIG. 5c, carrier 150 is removed by chemical etching, mechanical peeling, CMP, mechanical grinding, thermal bake, UV light, laser scanning, or wet stripping to expose active surface 130 of semiconductor die 124. In one embodiment, as shown in FIG. 5c, active surface 130 of semiconductor die 124 is coplanar with a surface 176 of laminating layer 174. Semiconductor die 124 embedded within laminating layer 174 constitutes a reconfigured wafer 177. Conductive layer 172 is disposed over a surface of insulating film 170 opposite semiconductor die 124. Active surface 130 of semiconductor die 124 is exposed for electrical redistribution.

Reconfigured wafer 177, comprising semiconductor die 124, insulating film 170, laminating layer 174, and conductive layer 172, embeds and supports semiconductor die 124 with reduced process steps. Insulating film 170 and laminating layer 174, as prefabricated components laminated over semiconductor die 124, do not require being formed or built up over the semiconductor die 124. Insulating film 170 and laminating layer 174 reduce process steps because insulating film 170 and laminating layer 174, in combination with additional layers, can be processed and applied continuously over multiple semiconductor die packages such as reconstituted wafer 156. Insulating film 170 and laminating layer 174 are not susceptible to complications arising from the application of conventional insulating materials. For example, as prefabricated structures, insulating film 170 and laminating layer 174 reduce the formation of voids, roughness, and imperfections generated by conventional liquid coating processes. Insulating film 170 and laminating layer 174 reduce the likelihood of warpage in a semiconductor package. Insulating film 170 and laminating layer 174 improve environmental conditions by, e.g., reducing solvent evaporation and the creation of wasteful byproducts typically generated with liquid insulating materials. Insulating film 170 and laminating layer 174 have a reduced CTE, and high insulation reliability. Insulating film 170 and laminating layer 174 reduce shifting of semiconductor die 124 during subsequent processing steps. Insulating film 170 and laminating layer 174 have advanced adhesive properties. With semiconductor die 124 embedded within laminating film 174 and insulating film 170 and conductive layer 172 providing structural support, reconfigured wafer 177 is a robust and secure semiconductor package.

Reconfigured wafer 177 is well-suited for receiving additional semiconductor components. For example, laminating layer 174 has smooth surfaces which assists with the formation of interconnect structures over laminating layer 174. With smoother surfaces, the interface between laminating layer 174 and conductive layers formed on laminating layer 174 has reduced imperfections and is significantly more linear across the interface. A more linear interface between laminating layer 174 and conductive layers disposed on laminating layer 174 affords lower resistance at the interface and improvements in signal transmission.

FIGS. 6a-6c illustrate, in relation to FIGS. 1 and 2a-2d a process of disposing an insulating film over a semiconductor die without using a carrier. FIG. 6a shows semiconductor die 124, singulated from a semiconductor wafer similar to FIGS. 2a-2d, disposed over an insulating film 180 with back surface 128 oriented towards insulating film 180 and active surface 130 oriented away from insulating film 180.

Insulating film 180 is a thin prefabricated reinforced laminating insulating film, sheet mold, or layer similar to insulating film 160. Insulating film 180 contains one or more glass fibers, glass fillers, or glass cloth. In some embodiments, insulating film 180 includes epoxy, epoxy resin, polymeric materials, thermoset plastic laminate, or other non-conductive materials. In some embodiments, insulating film 180 is a multilayered film including a plurality of resin layers, polyester film layers, and polypropylene film layers.

A conductive layer, thin copper film, or copper foil 182 is disposed on a surface of insulating film 180 opposite semiconductor die 124 using PVD, CVD, electrolytic plating, electroless plating process, or other suitable metal deposition process. Conductive layer 182 can be one or more layers of Al, Cu, Sn, Ni, Au, Ag, or other suitable electrically conductive material. Alternatively, conductive layer 182 is disposed separately over a temporary transfer film using PVD, CVD, electrolytic plating, electroless plating process, or other suitable metal deposition process. Conductive layer 182 and temporary transfer film is then laminated over a surface of insulating film 180 followed by removal of the temporary transfer film leaving conductive layer 182 disposed on the surface of insulating film 180. In some embodiments, the thickness of conductive layer 182 ranges from 0.10 µm to 5 µm such that conductive layer 182 is a very thin film structure which contributes to the formation of a semiconductor package with reduced thickness. Conductive layer 182 provides additional stiffness and contributes to the structural stability of insulating film 180.

In FIG. 6b, a gang press 184 is brought into contact with active surface 130 of semiconductor die 124. Gang press 184 extends to the edges of insulating film 180 to cover active surface 130 and insulating film 180. Gang press 184 applies a force F under an elevated temperature to facilitate the pressing and penetration of semiconductor die 124 into insulating film 180, thereby displacing a portion of insulating film 180. Once semiconductor die 124 are embedded within insulating film 180, heat or heated air is introduced in order to cure insulating film 180. In some embodiments, gang press 184 includes a heat tip.

In FIG. 6c, gang press 184 is removed to expose active surface 130 of semiconductor die 124. In one embodiment, as shown in FIG. 6c, active surface 130 of semiconductor die 124 is coplanar with a surface 186 of insulating film 180. Semiconductor die 124 embedded within insulating film 180 constitutes a reconfigured wafer 188. Active surface 130 of semiconductor die 124 is exposed for electrical redistribution.

Reconfigured wafer 188, comprising semiconductor die 124, insulating film 180, and conductive layer 182 embeds and supports semiconductor die 124 with reduced process steps. Insulating film 180, as a prefabricated component, does not require being formed or built up over the semiconductor die 124. Insulating film 180 reduces process steps because insulating film 180 and additional insulating films similar to insulating film 180 can be processed and applied continuously over multiple semiconductor die. Insulating film 180 is not susceptible to complications arising from the application of conventional insulating materials. For example, as a prefabricated structure, insulating film 180 reduces the formation of voids, roughness, and imperfections generated by conventional liquid coating processes. Insulating film 180 reduces the likelihood of warpage in a semiconductor package. Insulating film 180 improves environmental conditions by, e.g., reducing solvent evaporation and the creation of wasteful byproducts typically generated with liquid insulating materials. Insulating film 180 has a reduced CTE, and high insulation reliability. Insulating film 180 reduces shifting of semiconductor die 124 during subsequent processing steps. Insulating film 180 has advanced adhesive properties. Insulating film 180, reinforced with glass fibers, glass fillers, or glass cloth, combined with conductive layer 182 is a robust and secure embedding material for semiconductor die 124 and provides enhanced structural stability across the thickness of reconfigured wafer 188.

Reconfigured wafer 188 is well-suited for receiving additional semiconductor components. For example, insulating film 180 has smooth surfaces which assists with the formation of interconnect structures over insulating film 180. With smoother surfaces, the interface between insulating film 180 and conductive layers formed on insulating film 180 has reduced imperfections and is significantly more linear across the interface. For example, the interface between conductive layer 182 and insulating film 180 is more linear with reduced imperfections along the interface. A more linear interface between insulating film 180 and conductive layers disposed on insulating film 180 affords lower resistance at the interface and improvements in signal transmission.

Figure 7B:
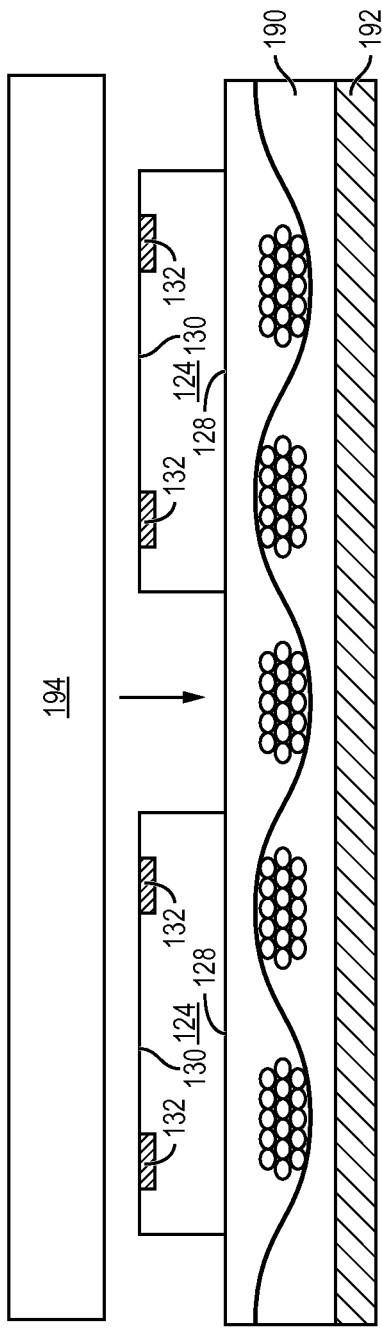
Figure 7C:
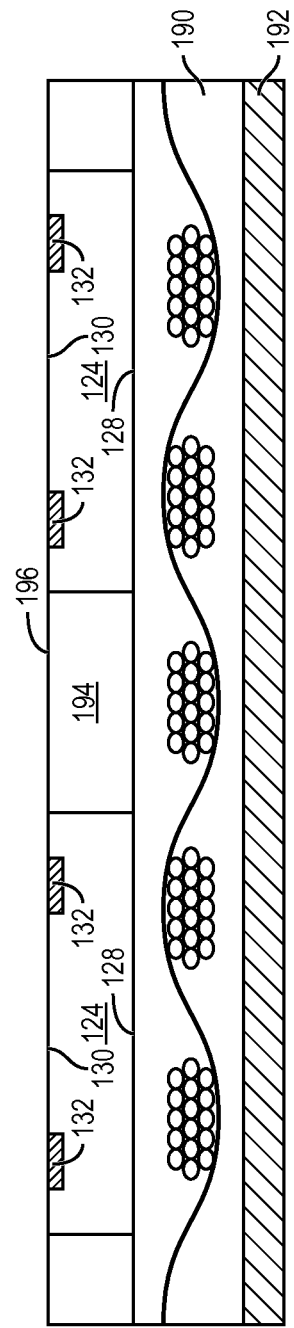

FIGS. 7a-7c illustrate, in relation to FIGS. 1 and 2a-2d another process of disposing an insulating film over a semiconductor die without using a carrier. FIG. 7a shows semiconductor die 124, singulated from a semiconductor wafer similar to FIGS. 2a-2d, disposed over an insulating film 190 with back surface 128 oriented towards insulating film 190 and active surface 130 oriented away from insulating film 190.

Insulating film 190 is a thin prefabricated reinforced laminating insulating film, sheet mold, or layer containing one or more glass fibers, glass fillers, or glass cloth similar to insulating film 160. In some embodiments, insulating film 190 includes epoxy, epoxy resin, polymeric materials, thermoset plastic laminate, or other non-conductive materials. In some embodiments, insulating film 190 is a multilayered film including a plurality of resin layers, polyester film layers, and polypropylene film layers.

A conductive layer, thin copper film, or copper foil 192, similar to conductive layer 162 is disposed over insulating film 190 opposite semiconductor die 124 using PVD, CVD, electrolytic plating, electroless plating process, or other suitable metal deposition process. Conductive layer 192 can be one or more layers of Al, Cu, Sn, Ni, Au, Ag, or other suitable electrically conductive material. Alternatively, conductive layer 192 is disposed separately over a temporary transfer film using PVD, CVD, electrolytic plating, electroless plating process, or other suitable metal deposition process. Conductive layer 192 and temporary transfer film are then laminated over a surface of insulating film 190 followed by removal of the temporary transfer film leaving conductive layer 192 disposed on the surface of insulating film 190. In some embodiments, the thickness of conductive layer 192 ranges from 0.10 μm to 5 μm such that conductive layer 192 is a very thin film structure which contributes to the formation of a semiconductor package with reduced thickness. Conductive layer 192 provides additional stiffness and contributes to the structural stability of insulating film 190.

FIG. 7b shows a prefabricated laminating layer 194 is disposed over semiconductor die 124. In some embodiments, laminating layer 194 is a film layer with or without glass fibers, glass fillers, or glass cloth. In some embodiments, laminating layer 194 contains epoxy, epoxy resin, polymeric materials, thermoset plastic laminate, or other non-conductive materials. In some embodiments, laminating layer 194 is a multilayered film including a plurality of resin layers, polyester film layers, and polypropylene film layers.

In FIG. 7b, a combination of vacuum, heat, and pressure is applied to laminating layer 194 in order to facilitate the lamination of laminating layer 194 over semiconductor die 124 and insulating film 190, thereby embedding semiconductor die 124 within laminating layer 194. In some embodiments, laminating layer 194 is laminated over semiconductor die 124 by vacuum lamination using, e.g., a vacuum hot press, followed by the introduction of heat or heated air in order to cure laminating layer 194. In some embodiments, semiconductor die 124 undergoes surface treatment and pre-drying prior to application of laminating layer 194. Laminating layer 194 over insulating film 190 provides a dual reinforced layer by combination of insulating film 190 and laminating layer 194.

FIG. 7c shows semiconductor die 124 embedded within laminating layer 194 over insulating film 190 with insulating film 190 over back surface 128 of semiconductor die 124. In some embodiments, a portion of insulating film 190 or laminating layer 194 is removed after embedding the semiconductor die 124 within laminating layer 194. In one embodiment, as shown in FIG. 7c, active surface 130 of semiconductor die 124 is coplanar with a surface 196 of laminating layer 194. Semiconductor die 124 embedded within laminating layer 194 over insulating film 190 constitutes a reconfigured wafer 197. Conductive layer 192 is disposed over a surface of insulating film 190 opposite semiconductor die 124. Laminating layer 194 covers side surfaces and back surface 128 of semiconductor die 124 to secure semiconductor die 124. Active surface 130 of semiconductor die 124 is exposed for electrical redistribution. In some embodiments, laminating layer 194 has a predetermined thickness substantially equal to a thickness of semiconductor die 124. Laminating layer 194 with the predetermined thickness allows active surface 130 to be exposed from laminating layer 194 and facilitates active surface 130 of semiconductor die 124 being coplanar with a surface 196 of laminating layer 194 after embedding semiconductor die 124 within laminating layer 194. The predetermined thickness of laminating layer 194 reduces manufacturing steps because portions of laminating layer 194 do not have to be removed to expose active surface 130 or make active surface 130 of semiconductor die 124 coplanar with a surface 196 of laminating layer 194.

Reconfigured wafer 197, comprising insulating film 190, laminating layer 194, and conductive layer 192 embeds and supports semiconductor die 124 with reduced process steps. Insulating film 190 and laminating layer 194, as prefabricated components, do not require being formed or built up over the semiconductor die 124. Insulating film 190 and laminating layer 194 reduce process steps because insulating film 190 and laminating layer 194, in combination with additional layers, can be processed and applied continuously over multiple semiconductor die. Insulating film 190 and laminating layer 194 are not susceptible to complications arising from the application of conventional insulating materials. For example, as prefabricated structures, insulating film 190 and laminating layer 194 reduce the formation of voids, roughness, and imperfections generated by conventional liquid coating processes. Insulating film 190 and laminating layer 194 reduce the likelihood of warpage in a semiconductor package. Insulating film 190 and laminating layer 194 improve environmental conditions by, e.g., reducing solvent evaporation and the creation of wasteful byproducts typically generated with liquid insulating materials. Insulating film 190 and laminating layer 194 have a reduced CTE, and high insulation reliability. Insulating film 190 and laminating layer 194 reduce shifting of semiconductor die 124 during subsequent processing steps. Insulating film 190 and laminating layer 194 have advanced adhesive properties. With semiconductor die 124 embedded within laminating film 194 and insulating film 190 and conductive layer 192 providing structural support, reconfigured wafer 197 is a robust and secure semiconductor package.

Reconfigured wafer 197 is well-suited for receiving additional semiconductor components. For example, laminating layer 194 has smooth surfaces which assists with the formation of interconnect structures over laminating layer 194. With smoother surfaces, the interface between laminating layer 194 and conductive layers formed on laminating layer 194 has reduced imperfections and is significantly more linear across the interface. A more linear interface between laminating layer 194 and conductive layers disposed on laminating layer 194 affords lower resistance at the interface and improvements in signal transmission.

Figure 8A:
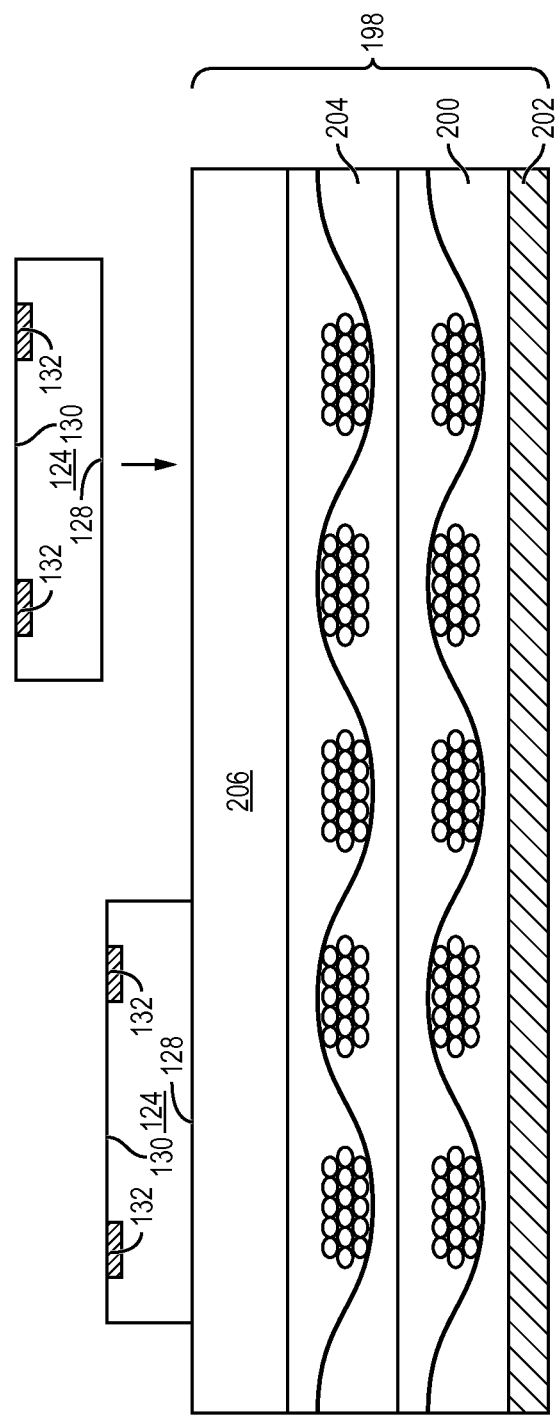
FIGS. 8a-8c illustrate another process of disposing an insulating film over a semiconductor die without using a carrier.
Figure 8B:
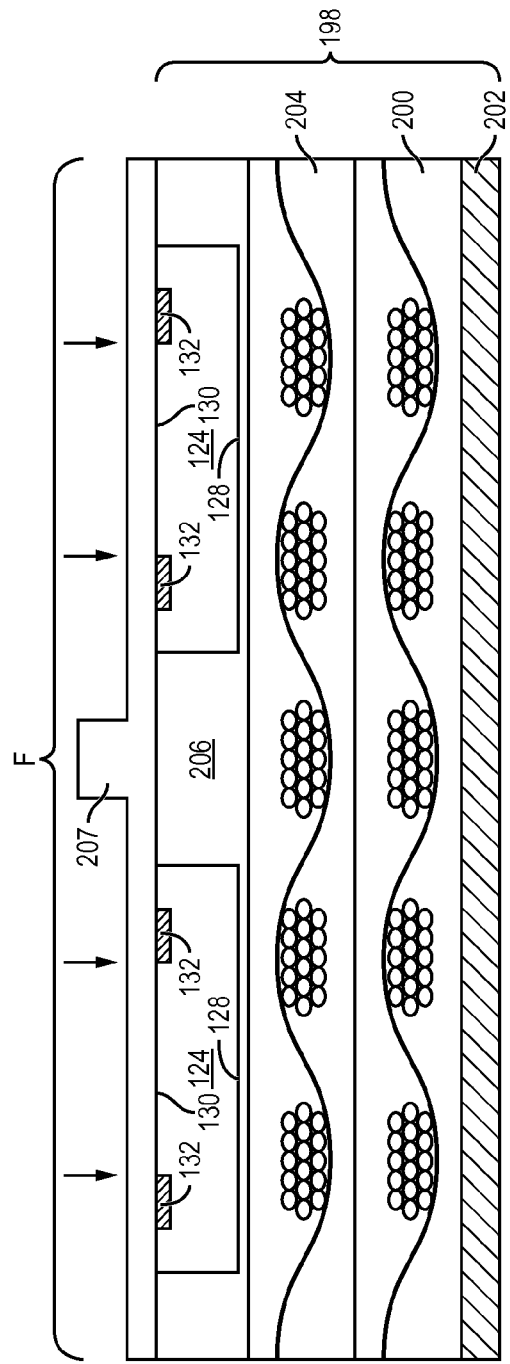
Figure 8C:
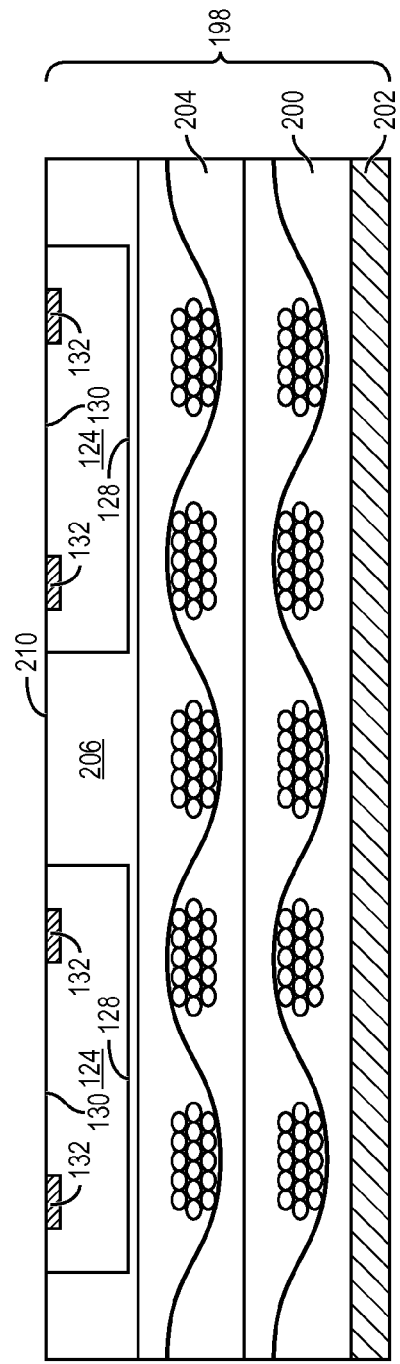

FIGS. 8a-8c illustrate, in relation to FIGS. 1 and 2a-2d another process of disposing an insulating film over a semiconductor die without using a carrier. FIG. 8a shows semiconductor die 124, singulated from a semiconductor wafer similar to FIGS. 2a-2d, disposed over a laminating layer 206 with back surface 128 oriented towards laminating layer 206 and active surface 130 oriented away from laminating layer 206.

Laminating layer 206 is a prefabricated laminating layer 206. In some embodiments, laminating layer 206 is a film layer with or without glass fibers, glass fillers, or glass cloth. In some embodiments, laminating layer 206 contains epoxy, epoxy resin, polymeric materials, thermoset plastic laminate, or other non-conductive materials. In some embodiments, laminating layer 206 is a multilayered film including a plurality of resin layers, polyester film layers, and polypropylene film layers.

Insulating film 204 is disposed over laminating layer 206. Insulating film 204 is a thin reinforced laminating insulating film, sheet mold, or layer containing one or more glass fibers, glass fillers, or glass cloth similar to insulating film 160. In some embodiments, insulating film 204 includes epoxy, epoxy resin, polymeric materials, thermoset plastic laminate, or other non-conductive materials. In some embodiments, insulating film 204 is a multilayered film including a plurality of resin layers, polyester film layers, and polypropylene film layers.

Insulating film 200 is disposed over insulating film 204. Insulating film 200 is a thin reinforced laminating insulating film, sheet mold, or layer containing one or more glass fibers, glass fillers, or glass cloth similar to insulating film 160. In some embodiments, insulating film 200 includes epoxy, epoxy resin, polymeric materials, thermoset plastic laminate, or other non-conductive materials. In some embodiments, insulating film 200 is a multilayered film including a plurality of resin layers, polyester film layers, and polypropylene film layers.

A conductive layer, thin copper film, or copper foil 202, similar to conductive layer 162 is disposed over insulating film 200 opposite insulating film 204 using PVD, CVD, electrolytic plating, electroless plating process, or other suitable metal deposition process. Conductive layer 202 can be one or more layers of Al, Cu, Sn, Ni, Au, Ag, or other suitable electrically conductive material. Alternatively, conductive layer 202 is disposed separately over a temporary transfer film using PVD, CVD, electrolytic plating, electroless plating process, or other suitable metal deposition process. Conductive layer 202 and temporary transfer film are then laminated over a surface of insulating film 200 followed by removal of the temporary transfer film leaving conductive layer 202 disposed on the surface of insulating film 200. In some embodiments, the thickness of conductive layer 202 ranges from 0.10 µm to 5 µm such that conductive layer 202 is a very thin film structure which contributes to the formation of a semiconductor package with reduced thickness. Conductive layer 202 provides additional stiffness and contributes to the structural stability of insulating film 200.

Insulating film 200, insulating film 204, and laminating layer 206 in combination form a prefabricated multilayered insulating film 198 as a plurality of insulating films and laminating layers. Multilayered insulating film 198 is not limited to the number of layers shown in FIGS. 8a-8c and can comprise a variety of additional prefabricated layers.

In FIG. 8b, a gang press 207 is brought into contact with active surface 130 of semiconductor die 124. Gang press 207 extends to the edges of laminating layer 206 to cover active surface 130 and laminating layer 206. Gang press 207 applies a force F under an elevated temperature to facilitate the pressing and penetration of semiconductor die 124 into laminating layer 206, thereby displacing a portion of laminating layer 206. Once semiconductor die 124 are embedded within laminating layer 206, heat or heated air is introduced in order to cure laminating layer 206. In some embodiments, gang press 207 includes a heat tip.

In FIG. 8c, gang press 207 is removed to expose active surface 130 of semiconductor die 124. Laminating layer 206 covers side surfaces and back surface 128 of semiconductor die 124. In one embodiment, as shown in FIG. 8c, active surface 130 of semiconductor die 124 is coplanar with a surface 210 of laminating layer 206. Semiconductor die 124 embedded within laminating layer 206 with insulating film 204, insulating film 200, and conductive layer 202 constitutes a reconfigured wafer 208. Active surface 130 of semiconductor die 124 is exposed for electrical redistribution.

Reconfigured wafer 208, comprising insulating film 204, insulating film 200, laminating layer 206, and conductive layer 202, embeds and supports semiconductor die 124 with reduced process steps. Insulating film 200, insulating film 204, and laminating layer 206, as prefabricated components, do not require being formed or built up over the semiconductor die 124. Insulating film 200, insulating film 204, and laminating layer 206 reduce process steps because insulating film 200, insulating film 204, and laminating layer 206, in combination with additional layers, can be processed and applied continuously over multiple semiconductor die. Insulating film 200, insulating film 204, and laminating layer 206 are not susceptible to complications arising from the application of conventional insulating materials. For example, as prefabricated structures, insulating film 200, insulating film 204, and laminating layer 206 reduce the formation of voids, roughness, and imperfections generated by conventional liquid coating processes. Insulating film 200, insulating film 204, and laminating layer 206 reduce the likelihood of warpage in a semiconductor package. Insulating film 200, insulating film 204, and laminating layer 206 improve environmental conditions by, e.g., reducing solvent evaporation and the creation of wasteful byproducts typically generated with liquid insulating materials. Insulating film 200, insulating film 204, and laminating layer 206 have a reduced CTE and high insulation reliability. Insulating film 200, insulating film 204, and laminating layer 206 reduce shifting of semiconductor die 124 during subsequent processing steps. Insulating film 200, insulating film 204, and laminating layer 206 have advanced adhesive properties. With semiconductor die 124 embedded within laminating film 206, and insulating film 200, insulating film 204, and conductive layer 202 providing structural support, reconfigured wafer 208 is a robust and secure semiconductor package.

Reconfigured wafer 208 is well-suited for receiving additional semiconductor components. For example, laminating layer 206 has smooth surfaces which assists with the formation of interconnect structures over laminating layer 206. With smoother surfaces, the interface between laminating layer 206 and conductive layers formed on laminating layer 206 has reduced imperfections and is significantly more linear across the interface. A more linear interface between laminating layer 206 and conductive layers disposed on laminating layer 206 affords lower resistance at the interface and improvements in signal transmission.

Figure 9:
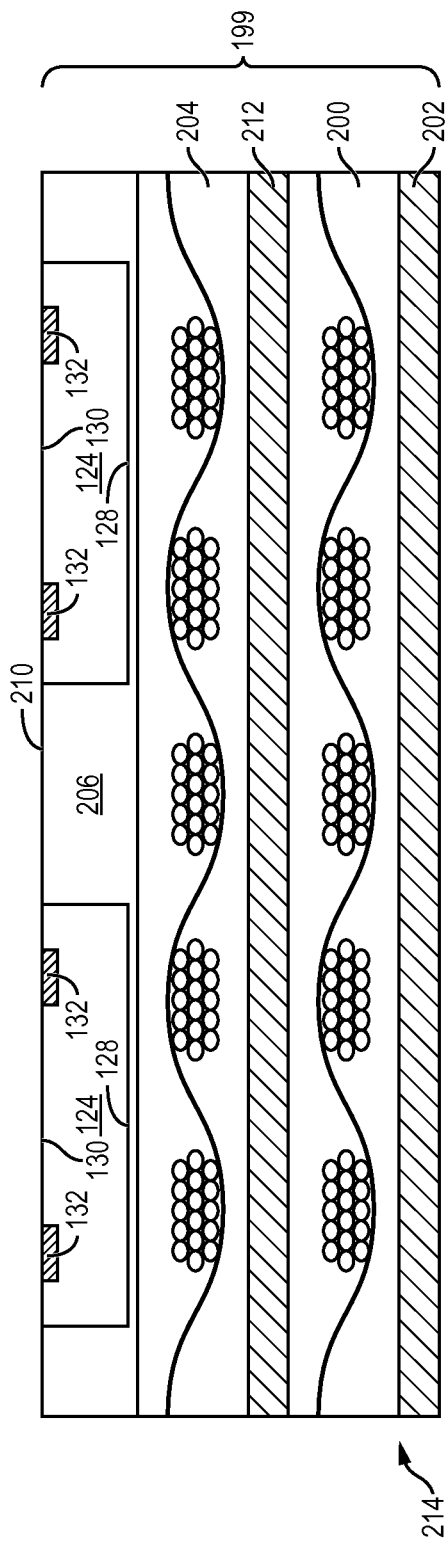
FIG. 9 illustrates a reconfigured wafer with embedded semiconductor die formed by a process similar to the process illustrated in FIGS. 8a-8c.

FIG. 9 shows a reconfigured wafer 214, formed by a process similar to the process illustrated in FIGS. 8a-8c. Semiconductor die 124, singulated from a semiconductor wafer similar to FIGS. 2a-2d, are embedded within laminating layer 206. Laminating layer 206 covers side surfaces and back surface 128 of semiconductor die 124. In one embodiment, active surface 130 of semiconductor die 124 is coplanar with a surface 210 of laminating layer 206. Active surface 130 of semiconductor die 124 is exposed for electrical redistribution.

Laminating layer 206 is a prefabricated laminating layer 206. In some embodiments, laminating layer 206 is a film layer with or without glass fibers, glass fillers, or glass cloth. In some embodiments, laminating layer 206 contains epoxy, epoxy resin, polymeric materials, thermoset plastic laminate, or other non-conductive materials. In some embodiments, laminating layer 206 is a multilayered film including a plurality of resin layers, polyester film layers, and polypropylene film layers.

Insulating film 204 is disposed over laminating layer 206. Insulating film 204 is a thin reinforced laminating insulating film, sheet mold, or layer containing one or more glass fibers, glass fillers, or glass cloth similar to insulating film 160. In some embodiments, insulating film 204 includes epoxy, epoxy resin, polymeric materials, thermoset plastic laminate, or other non-conductive materials. In some embodiments, insulating film 204 is a multilayered film including a plurality of resin layers, polyester film layers, and polypropylene film layers.

Insulating film 200 is disposed over insulating film 204. Insulating film 200 is a thin reinforced laminating insulating film, sheet mold, or layer containing one or more glass fibers, glass fillers, or glass cloth similar to insulating film 160. In some embodiments, insulating film 200 includes epoxy, epoxy resin, polymeric materials, thermoset plastic laminate, or other non-conductive materials. In some embodiments, insulating film 200 is a multilayered film including a plurality of resin layers, polyester film layers, and polypropylene film layers.

A conductive layer, thin copper film, or copper foil 202, similar to conductive layer 162 is disposed over insulating film 200 opposite insulating film 204 using PVD, CVD, electrolytic plating, electroless plating process, or other suitable metal deposition process. Conductive layer 202 can be one or more layers of Al, Cu, Sn, Ni, Au, Ag, or other suitable electrically conductive material. Alternatively, conductive layer 202 is disposed separately over a temporary transfer film using PVD, CVD, electrolytic plating, electroless plating process, or other suitable metal deposition process. Conductive layer 202 and temporary transfer film is then laminated over a surface of insulating film 200 followed by removal of the temporary transfer film leaving conductive layer 202 disposed on the surface of insulating film 200. In some embodiments, the thickness of conductive layer 202 ranges from 0.10 μm to 5 μm such that conductive layer 202 is a very thin film structure which contributes to the formation of a semiconductor package with reduced thickness. Conductive layer 202 provides additional stiffness and contributes to the structural stability of insulating film 200.

A conductive layer, thin copper film, or copper foil 212, similar to conductive layer 162 is disposed between insulating film 204 and insulating film 200 using PVD, CVD, electrolytic plating, electroless plating process, or other suitable metal deposition process. Conductive layer 212 can be one or more layers of Al, Cu, Sn, Ni, Au, Ag, or other suitable electrically conductive material. Alternatively, conductive layer 212 is disposed separately over a temporary transfer film using PVD, CVD, electrolytic plating, electroless plating process, or other suitable metal deposition process. Conductive layer 212 and temporary transfer film is then laminated over a surface of insulating film 200 followed by removal of the temporary transfer film leaving conductive layer 212 disposed on the surface of insulating film 200. In some embodiments, the thickness of conductive layer 212 ranges from 0.10 μm to 5 μm such that conductive layer 212 is a very thin film structure which contributes to the formation of a semiconductor package with reduced thickness. Conductive layer 212 provides additional stiffness and structural stability.

Insulating film 200, insulating film 204, and laminating layer 206 in combination form a prefabricated multilayered insulating film 199 as a plurality of insulating films and laminating layers. Multilayered insulating film 199 is not limited to the number of layers shown and can comprise a variety of additional prefabricated layers.

Laminating layer 206 covers side surfaces and back surface 128 of semiconductor die 124. Active surface 130 of semiconductor die 124 is coplanar with a surface 210 of laminating layer 206. Semiconductor die 124 embedded within laminating layer 206 with insulating film 204, insulating film 200, conductive layer 212, and conductive layer 202 constitutes a reconfigured wafer 214. Active surface 130 of semiconductor die 124 is exposed for electrical redistribution.

Reconfigured wafer 214, comprising insulating film 204, insulating film 200, laminating layer 206, conductive layer 202, and conductive layer 212 embeds and supports semiconductor die 124 with reduced process steps. Insulating film 200, insulating film 204, and laminating layer 206, as prefabricated components laminated over semiconductor die 124, do not require being formed or built up over the semiconductor die 124. Insulating film 200, insulating film 204, and laminating layer 206 reduce process steps because insulating film 200, insulating film 204, and laminating layer 206, in combination with additional layers, can be processed and applied continuously over multiple semiconductor die. Insulating film 200, insulating film 204, and laminating layer 206 are not susceptible to complications arising from the application of conventional insulating materials. For example, as prefabricated structures, insulating film 200, insulating film 204, and laminating layer 206 reduce the formation of voids, roughness, and imperfections generated by conventional liquid coating processes. Insulating film 200, insulating film 204, and laminating layer 206 reduce the likelihood of warpage in a semiconductor package. Insulating film 200, insulating film 204, and laminating layer 206 improve environmental conditions by, e.g., reducing solvent evaporation and the creation of wasteful byproducts typically generated with liquid insulating materials. Insulating film 200, insulating film 204, and laminating layer 206 have a reduced CTE, and high insulation reliability. Insulating film 200, insulating film 204, and laminating layer 206 reduce shifting of semiconductor die 124 during subsequent processing steps. Insulating film 200, insulating film 204, and laminating layer 206 have advanced adhesive properties. With semiconductor die 124 embedded within laminating film 206, and insulating film 200, insulating film 204, conductive layer 212, and conductive layer 202 providing structural support, reconfigured wafer 214 is a robust and secure semiconductor package.

Reconfigured wafer 214 is well-suited for receiving additional semiconductor components. For example, laminating layer 206 has smooth surfaces which assists with the formation of interconnect structures over laminating layer 206. With smoother surfaces, the interface between laminating layer 206 and conductive layers formed on laminating layer 206 has reduced imperfections and is significantly more linear across the interface. A more linear interface between laminating layer 206 and conductive layers disposed on laminating layer 206 affords lower resistance at the interface and improvements in signal transmission.

Figure 10A:
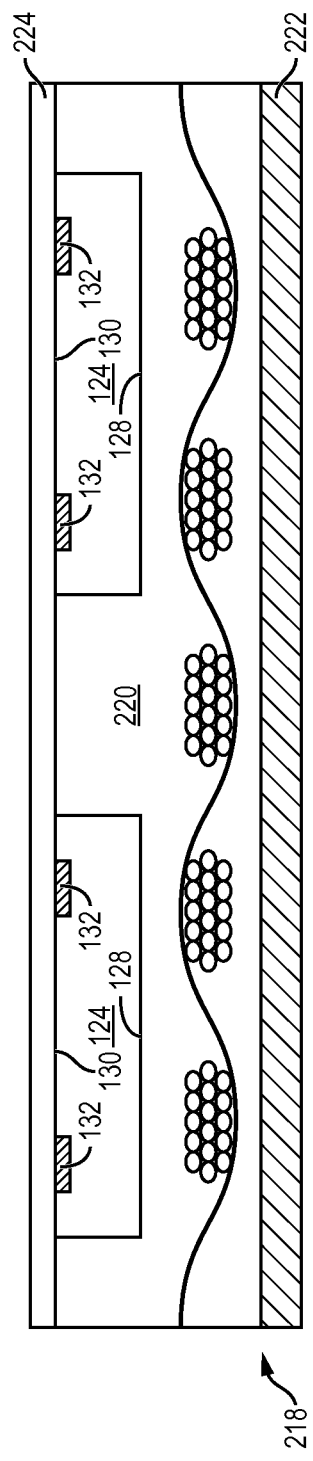

FIGS. 10a-10k illustrate, in relation to FIGS. 1 and 2a-2d a process of forming a build-up interconnect structure over a reconfigured wafer 218 with embedded semiconductor 124. Reconfigured wafer 218 is similar to the reconfigured wafers described in FIG. 4c, 5c, 6c, 7c, 8c, or 9. FIG. 10a shows semiconductor die 124 embedded within insulating film 220. Insulating film 220 is a reinforced laminating insulating film, sheet mold, or layer similar to insulating film 160. Insulating film 220 contains one or more glass fibers, glass fillers, or glass cloth. In some embodiments, insulating film 220 includes epoxy, epoxy resin, polymeric materials, thermoset plastic laminate, or other non-conductive materials. In some embodiments, insulating film 220 is a multilayered film including a plurality of resin layers, polyester film layers, and polypropylene film layers.

A conductive layer, copper film, or copper foil 222, similar to conductive layer 162, is formed over a surface of insulating film 220 using PVD, CVD, electrolytic plating, electroless plating process, or other suitable metal deposition process. Conductive layer 222 can be one or more layers of Al, Cu, Sn, Ni, Au, Ag, or other suitable electrically conductive material. Alternatively, conductive layer 222 is disposed separately over a temporary transfer film using PVD, CVD, electrolytic plating, electroless plating process, or other suitable metal deposition process. Conductive layer 222 and temporary transfer film is then laminated over a surface of insulating film 220 followed by removal of the temporary transfer film leaving conductive layer 222 disposed on the surface of insulating film 220. In some embodiments, the thickness of conductive layer 222 ranges from 0.10 μm to 5 μm such that conductive layer 222 is a very thin film structure which contributes to the formation of a semiconductor package with reduced thickness. Conductive layer 222 provides additional stiffness and contributes to the structural stability of insulating film 220.

An insulating or passivation layer 224 is formed over active surface 130 and insulating film 220 using PVD, CVD, printing, lamination, spin coating, spray coating, sintering, or thermal oxidation. The insulating layer 224 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The smooth surfaces of insulating film 220 facilitate an interface between insulating layer 224 and insulating film 220 with reduced imperfections along the interface. In some embodiments, insulating layer 224 is conformally coated over semiconductor die 124. Alternatively, insulating layer 224 is a laminated insulating, passivation, dielectric, or epoxy layer, similar to laminating layer 194 and laminated over insulating film 220 similar to the process illustrated in FIGS. 7a-7c. Insulating layer 224 may further comprise one or more resist layers.

Figure 10B:
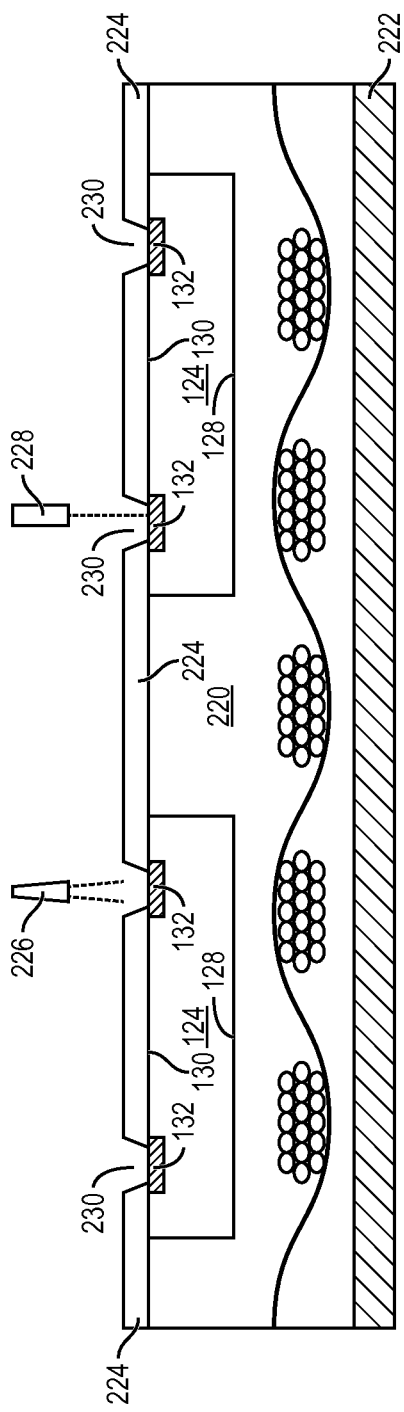

A portion of insulating layer 224 is removed by an etching process 226 or laser direct ablation (LDA) 228 to form vias 230 and expose contact pads 132 over active surface 130 as shown in FIG. 10b. In some embodiments, vias 230 are formed using mask-based exposure, a stepper, and a large field exposure system.

Figure 10C:
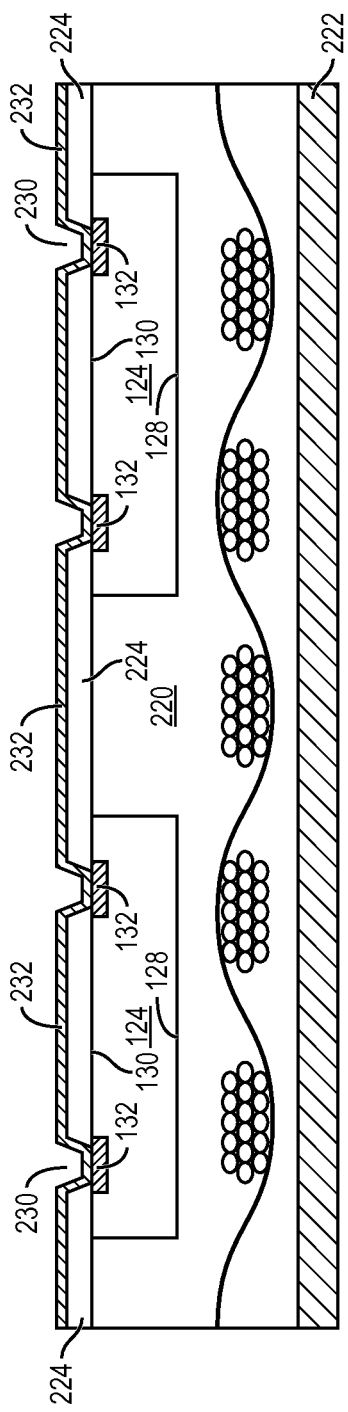

In FIG. 10c, an electrically conductive layer 232 is formed over insulating layer 224 and semiconductor die 124 using PVD, CVD, electrolytic plating, electroless plating, or other suitable metal deposition process. Conductive layer 232 contains one or more layers of Al, Cu, Sn, Ni, Au, Ag, or other suitable electrically conductive material. A portion of conductive layer 232 is electrically connected to conductive layer 132 of semiconductor die 124 through vias 230. In some embodiments, conductive layer 232 follows the contours of insulating layer 224. In one embodiment, conductive layer 232 operates as a seed layer.

In FIG. 10d, an insulating or passivation layer 236 is formed over conductive layer 232 using PVD, CVD, printing, lamination, spin coating, spray coating, sintering or thermal oxidation. Insulating layer 236 contains one or more layers of SiO2, Si3N4, SiON, Ta2O5, Al2O3, or other material having similar insulating and structural properties. A portion of insulating layer 236 is removed by an etching process or LDA 228 to form openings 237 over vias 230. In some embodiments, openings 237 are a trench pattern formed using mask-based exposure, a stepper, and a large field exposure system.

In FIG. 10e, an electrically conductive layer 238 is formed over insulating layer 224 and conductive layer 232 using PVD, CVD, electrolytic plating, electroless plating, or other suitable metal deposition process. Conductive layer 238 contains one or more layers of Al, Cu, Sn, Ni, Au, Ag, or other suitable electrically conductive material. A portion of conductive layer 238 is electrically connected to conductive layer 132 through openings 237. In one embodiment, conductive layer 238 operates as a redistribution layer (RDL) to extend electrical connection from semiconductor die 124 to points external to semiconductor die 124.

Figure 10F:
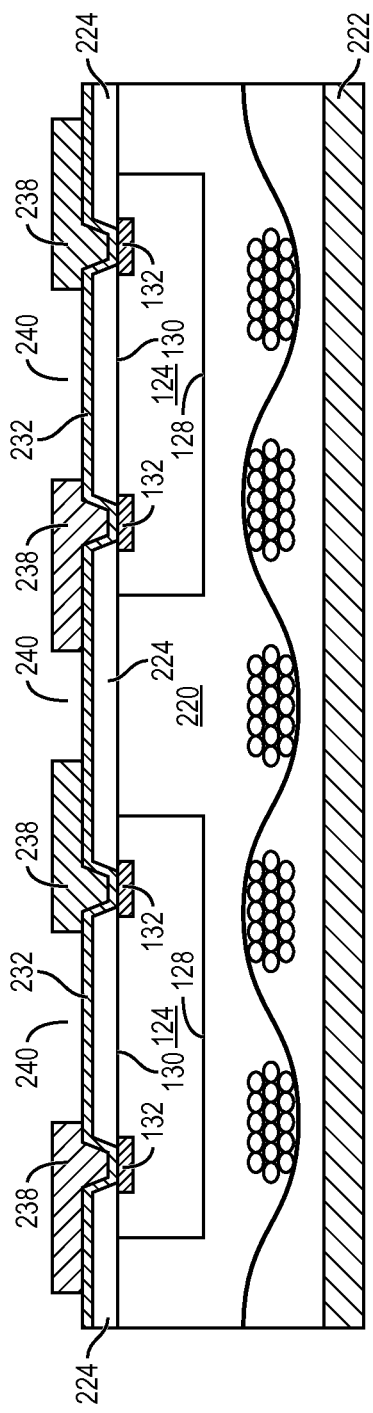

In FIG. 10f, insulating layer 236 is removed by an exposure or development process, LDA, etching, or other suitable process leaving gaps 240 over insulating layer 224 between portions of conductive layer 238.

Figure 10G:
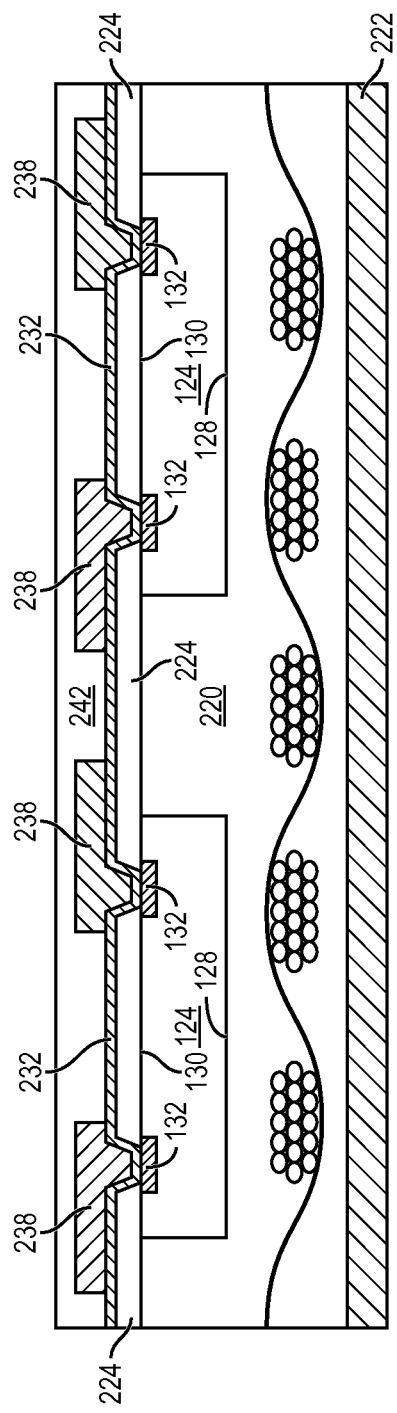
Figure 10H:
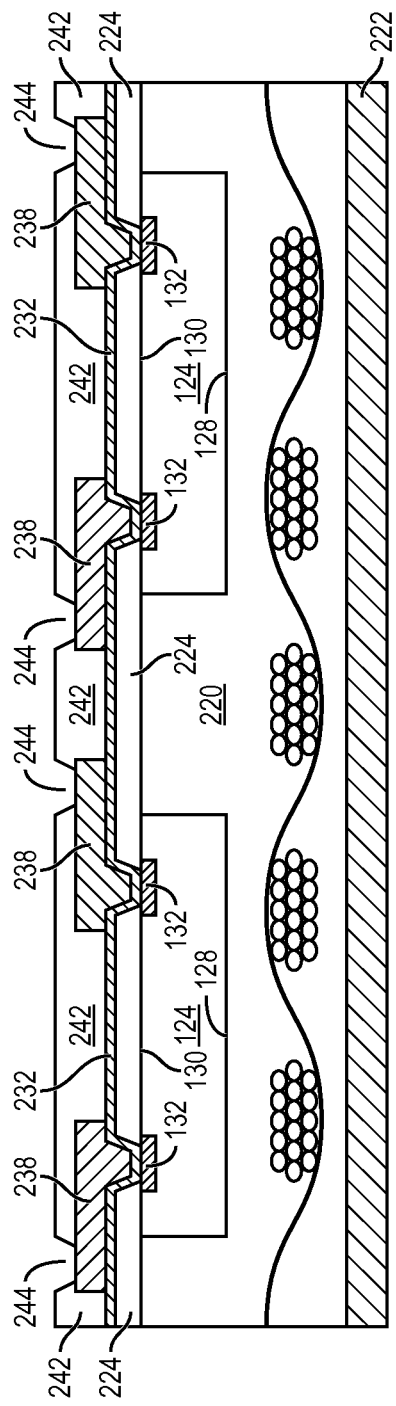

In FIG. 10g, an insulating or passivation layer 242 is formed over insulating layer 224, gaps 240, conductive layer 232, and conductive layer 238 using PVD, CVD, printing, lamination, spin coating, spray coating, sintering or thermal oxidation. Insulating layer 242 contains one or more layers of SiO2, Si3N4, SiON, Ta2O5, Al2O3, or other material having similar insulating and structural properties. A portion of insulating layer 242 is removed by an exposure or development process, LDA, etching, or other suitable process to form vias 244 in insulating layer 242 to expose portions of conductive layer 238 for subsequent electrical interconnection as shown in FIG. 10h.

Figure 10I:
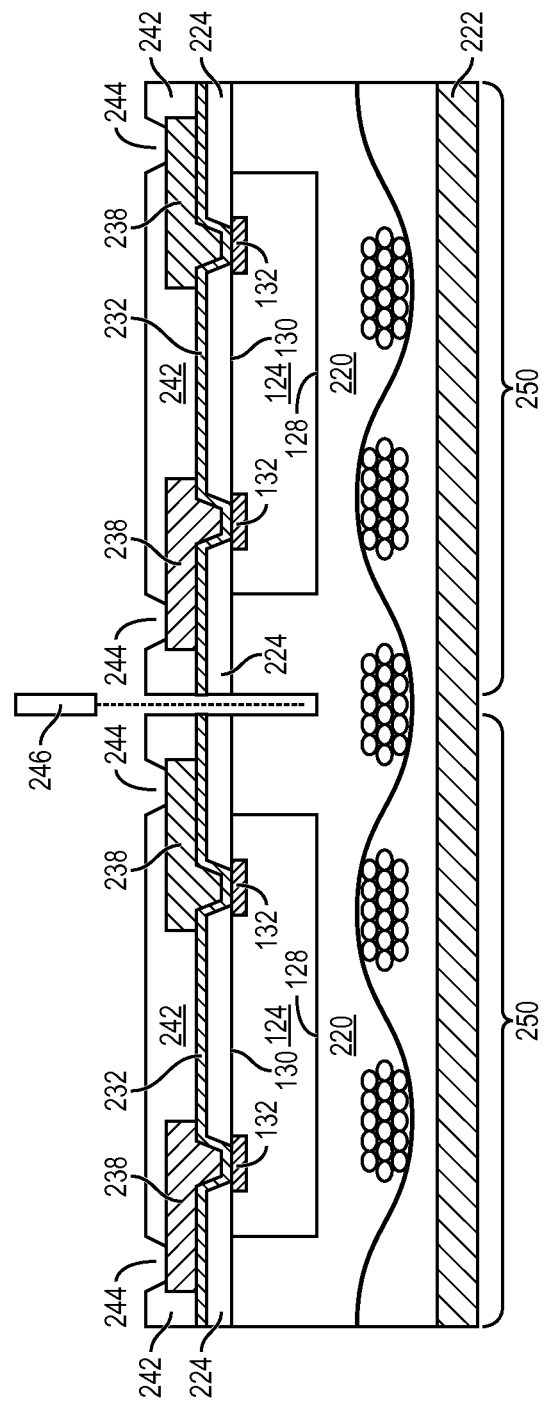

FIG. 10i shows reconfigured wafer 218 is singulated using a saw blade or laser cutting tool 246 into individual semiconductor packages 250 before addition of a bump material. Alternatively, a bump material 254 is disposed within vias 244 prior to singulation as shown in FIG. 10j to form individual semiconductor packages 252.

Bump material 254 is deposited over conductive layer 238 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 238 using a suitable attachment or bonding process. In one embodiment, the bump material is reflowed by heating the material above its melting point to form balls or bumps 254. In some applications, bumps 254 are reflowed a second time to improve electrical contact to conductive layer 238. Bumps 254 can also be compression bonded or thermocompression bonded to conductive layer 238. Bumps 254 represent one type of interconnect structure that can be formed over conductive layer 238. The interconnect structure can also use conductive paste, stud bump, micro bump, or other electrical interconnect.

FIG. 10k shows a semiconductor package 250 after singulation from reconstituted wafer 218 with semiconductor die 124 embedded within insulating film 220 and build up interconnect structure 256 formed over active surface 130 of semiconductor die 124. Interconnect structure 256 includes a combination of insulating layer 224, insulating layer 242, conductive layer 232, conductive layer 238, and bumps 254. Interconnect structure 256 over insulating film 220 provides high density wiring patterns which achieves significant performance improvements. Interconnect structure 256 has improved reliability and is efficient for 3D integration and vertical stacking over semiconductor die 124. Further, interconnect structure 256 is a low cost addition to semiconductor package 250.

Insulating film 220 embeds and supports semiconductor die 124 with reduced process steps. Insulating film 220, as a prefabricated component laminated over semiconductor die 124, does not require being formed or built up over the semiconductor die 124. Insulating film 220 reduces process steps because insulating film 220 and additional insulating films similar to insulating film 220 can be processed and applied continuously over semiconductor die 124. Insulating film 220 is not susceptible to complications arising from the application of conventional insulating materials. For example, as a prefabricated structure, insulating film 220 reduces the formation of voids, roughness, and imperfections generated by conventional liquid coating processes. Insulating film 220 reduces the likelihood of warpage in a semiconductor package. Insulating film 220 improves environmental conditions by, e.g., reducing solvent evaporation and the creation of wasteful byproducts typically generated with liquid insulating materials. Insulating film 220 has a reduced CTE, and high insulation reliability. Insulating film 220 reduces shifting of semiconductor die 124 during the formation of interconnect structure 256. Insulating film 220 has advanced adhesive properties and smooth surfaces which facilitates the formation of interconnect structure 256. Insulating film 220, reinforced with glass fibers, glass fillers, or glass cloth, combined with conductive layer 222 is a robust and secure embedding material for semiconductor die 124 and provides enhanced structural stability across the thickness of semiconductor package 250.

Figure 11A:
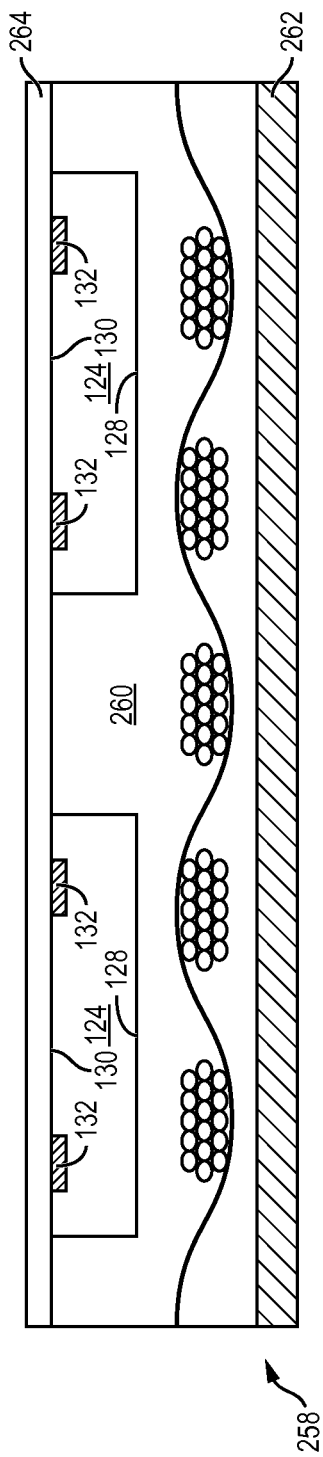

FIGS. 11a-11j illustrate, in relation to FIGS. 1 and 2a-2d a process of forming a build-up interconnect structure over a reconfigured wafer 258 with embedded semiconductor 124. Reconfigured wafer 258 is similar to the reconfigured wafers described in FIG. 4c, 5c, 6c, 7c, 8c, or 9. FIG. 11a shows semiconductor die 124 embedded within insulating film 260. Insulating film 260 is a reinforced laminating insulating film, sheet mold, or layer similar to insulating film 160. Insulating film 260 contains one or more glass fibers, glass fillers, or glass cloth. In some embodiments, insulating film 260 includes epoxy, epoxy resin, polymeric materials, thermoset plastic laminate, or other non-conductive materials. In some embodiments, insulating film 260 is a multi-layered film including a plurality of resin layers, polyester film layers, and polypropylene film layers.

A conductive layer, copper film, or copper foil 262, similar to conductive layer 162, is formed over a surface of insulating film 260 using PVD, CVD, electrolytic plating, electroless plating process, or other suitable metal deposition process. Conductive layer 262 can be one or more layers of Al, Cu, Sn, Ni, Au, Ag, or other suitable electrically conductive material. Alternatively, conductive layer 262 is disposed separately over a temporary transfer film using PVD, CVD, electrolytic plating, electroless plating process, or other suitable metal deposition process. Conductive layer 262 and temporary transfer film are then laminated over a surface of insulating film 260 followed by removal of the temporary transfer film leaving conductive layer 262 disposed on the surface of insulating film 260. In some embodiments, the thickness of conductive layer 262 ranges from 0.10 μm to 5 μm such that conductive layer 262 is a very thin film structure which contributes to the formation of a semiconductor package with reduced thickness. Conductive layer 262 provides additional stiffness and contributes to the structural stability of insulating film 260.

An insulating or passivation layer 264 is formed over active surface 130 and insulating film 260 using PVD, CVD, printing, lamination, spin coating, spray coating, sintering, or thermal oxidation. Insulating layer 264 contains one or more layers of SiO2, Si3N4, SiON, Ta2O5, Al2O3, or other material having similar insulating and structural properties. The smooth surfaces of insulating film 260 facilitate an interface between insulating layer 264 and insulating film 260 with reduced imperfections. Alternatively, insulating layer 264 is a laminated insulating, passivation, dielectric, or epoxy layer, similar to laminating layer 194 and is laminated over insulating film 260 similar to the process illustrated in FIGS. 7a-7c.

Figure 11B:
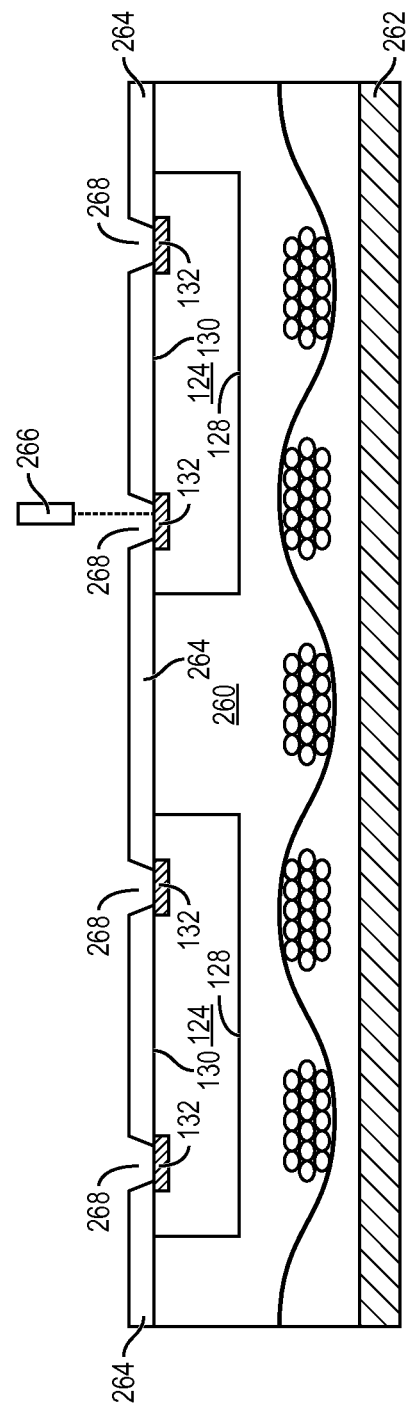

A portion of insulating layer 264 is removed by an etching process or LDA 266 to form vias 268 and expose contact pads 132 over active surface 130 as shown in FIG. 11b. In some embodiments, vias 268 are formed using mask-based exposure, a stepper, and a large field exposure system.

FIG. 11c shows an insulating or passivation layer 270 is formed over insulating layer 264 using PVD, CVD, printing, lamination, spin coating, spray coating, sintering or thermal oxidation. Insulating layer 270 contains one or more layers of SiO2, Si3N4, SiON, Ta2O5, Al2O3, or other material having similar insulating and structural properties. A portion of insulating layer 270 is removed by an etching process or LDA to form openings 272 over vias 268 as shown in FIG. 11c. In some embodiments, openings 272 are a trench pattern formed using mask-based exposure, a stepper, and a large field exposure system.

In FIG. 11d, an electrically conductive layer 276 is formed over insulating layer 264 and insulating layer 270 using PVD, CVD, electrolytic plating, electroless plating, or other suitable metal deposition process. Conductive layer 276 contains one or more layers of Al, Cu, Sn, Ni, Au, Ag, or other suitable electrically conductive material. A portion of conductive layer 276 is electrically connected to conductive layer 132 of semiconductor die 124 through vias 268 and openings 272. In some embodiments, conductive layer 276 is conformally applied to and follows the contours of insulating layer 264 and insulating layer 270. In one embodiment, conductive layer 276 operates as an activated trace pattern. In one embodiment, conductive layer 276 includes an under bump metallization (UBM) over conductive layer 132 having a wetting layer, barrier layer, and adhesive layer.

Figure 11E:
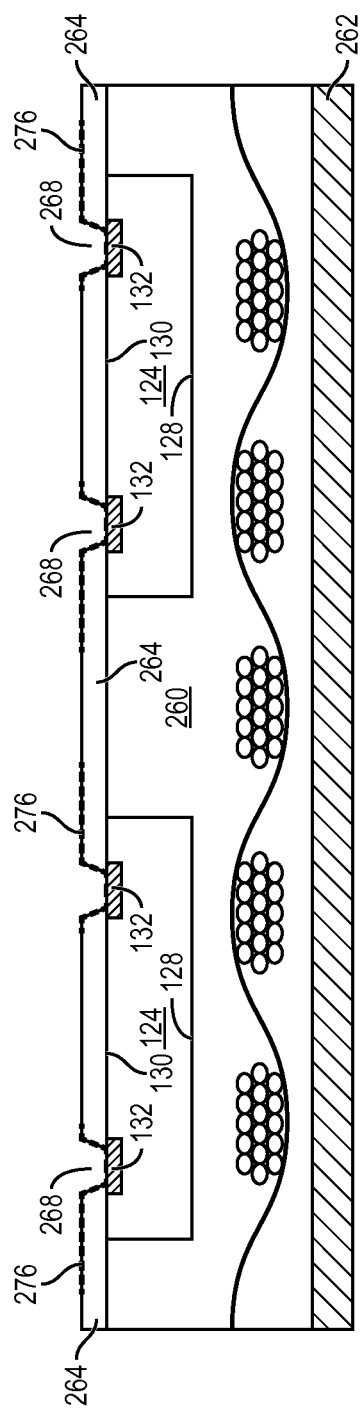

In FIG. 11e, insulating layer 270 and a first portion of conductive layer 276 is removed by an exposure or development process, LDA, etching, or other suitable process, eliminating openings 272. A second portion of conductive layer 276 remains over insulating layer 264 as an activated trace pattern.

Figure 11F:
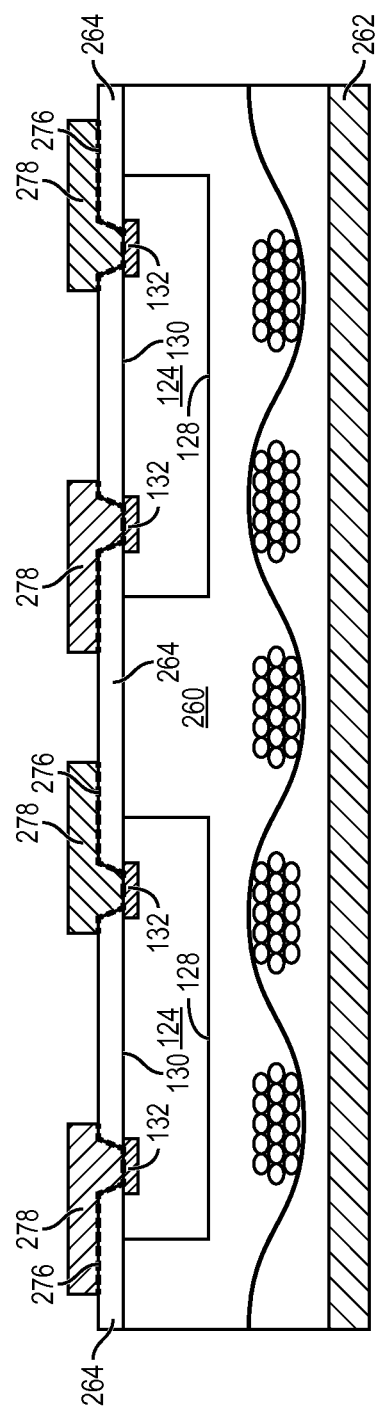

In FIG. 11f, an electrically conductive layer 278 is formed over insulating layer 264 and conductive layer 276 using PVD, CVD, electrolytic plating, electroless plating, or other suitable metal deposition process. Conductive layer 278 contains one or more layers of Al, Cu, Sn, Ni, Au, Ag, or other suitable electrically conductive material. A portion of conductive layer 278 is electrically connected to conductive layer 132 of semiconductor die 124 through vias 268 and conductive layer 276.

Figure 11G:
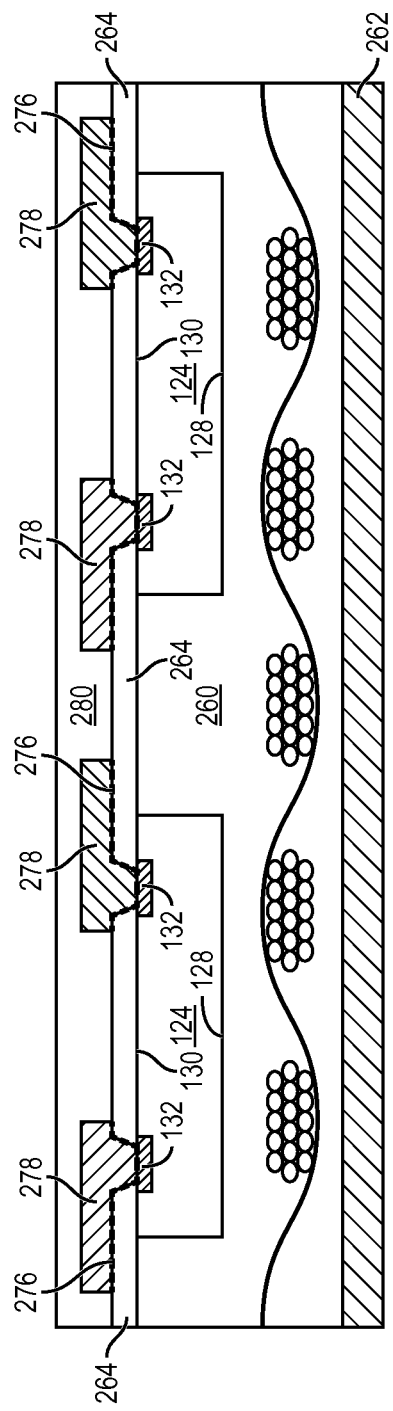
Figure 11H:
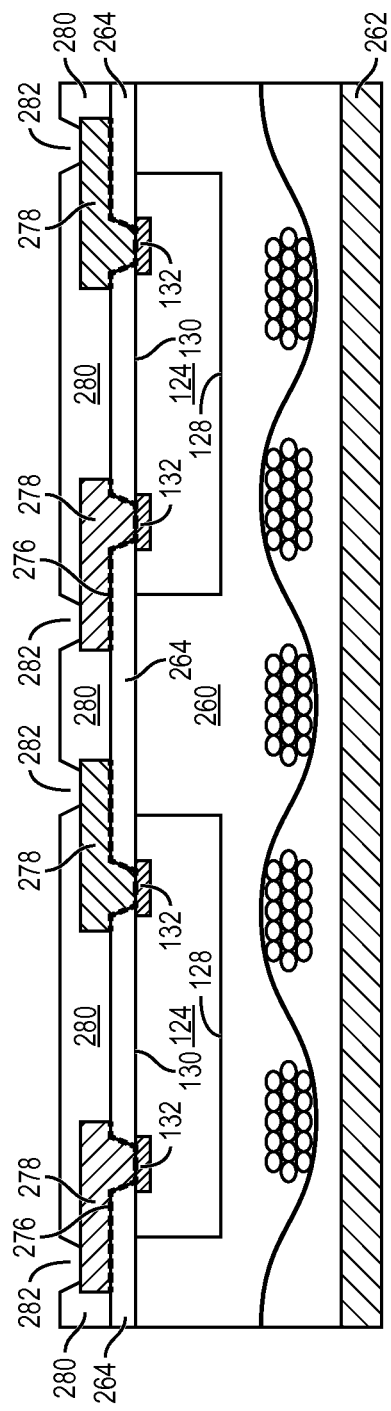

FIG. 11g shows an insulating or passivation layer 280 is formed over insulating layer 264 and conductive layer 278 using PVD, CVD, printing, lamination, spin coating, spray coating, sintering or thermal oxidation. Insulating layer 280 contains one or more layers of SiO2, Si3N4, SiON, Ta2O5, Al2O3, or other material having similar insulating and structural properties. A portion of insulating layer 280 is removed by an etching process or LDA to form openings or vias 282 over portions of conductive layer 278 as shown in FIG. 11h. In some embodiments, vias 282 are formed using mask-based exposure, a stepper, and a large field exposure system.

FIG. 11i shows reconfigured wafer 258 is singulated using a saw blade or laser cutting tool 286 into individual semiconductor packages 290. An electrically conductive bump material is deposited over conductive layer 278 within vias 282 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 278 using a suitable attachment or bonding process. In one embodiment, the bump material is reflowed by heating the material above its melting point to form balls or bumps 288. In some applications, bumps 288 are reflowed a second time to improve electrical contact to conductive layer 278. Bumps 288 can also be compression bonded or thermocompression bonded to conductive layer 278. Bumps 288 represent one type of interconnect structure that can be formed over conductive layer 278. The interconnect structure can also use conductive paste, stud bump, micro bump, or other electrical interconnect.

FIG. 11j shows a semiconductor package 290 after singulation from reconstituted wafer 258 with semiconductor die 124 embedded within insulating film 260 and build-up interconnect structure 294 formed over active surface 130 of semiconductor die 124. Interconnect structure 294 includes a combination of insulating layer 264, insulating layer 280, conductive layer 276, conductive layer 278, and bumps 288. Interconnect structure 294 over insulating film 260 provides high density wiring patterns which achieve significant performance improvements. Interconnect structure 294 has improved reliability and is efficient for 3D integration and vertical stacking over semiconductor die 124. Further, interconnect structure 294 is a low cost addition to semiconductor package 290.

Insulating film 260 embeds and supports semiconductor die 124 with reduced process steps. Insulating film 260, as a prefabricated component laminated over semiconductor die 124, does not require being formed or built up over the semiconductor die 124. Insulating film 260 reduces process steps because insulating film 260 and additional insulating films similar to insulating film 260 can be processed and applied continuously over semiconductor die 124. Insulating film 260 is not susceptible to complications arising from the application of conventional insulating materials. For example, as a prefabricated structure, insulating film 260 reduces the formation of voids, roughness, and imperfections generated by conventional liquid coating processes. Insulating film 260 reduces the likelihood of warpage in a semiconductor package. Insulating film 260 improves environmental conditions by, e.g., eliminating solvent evaporation and the creation of wasteful byproducts typically generated with liquid insulating materials. Insulating film 260 has a reduced CTE, and high insulation reliability. Insulating film 260 reduces shifting of semiconductor die 124 during the formation of interconnect structure 294. Insulating film 260 has advanced adhesive properties and smooth surfaces which facilitates the formation of interconnect structure 294. Insulating film 260, reinforced with glass fibers, glass fillers, or glass cloth, combined with conductive layer 262 is a robust and secure embedding material for semiconductor die 124 and provides enhanced structural stability across the thickness of semiconductor package 290.

Figure 12C:
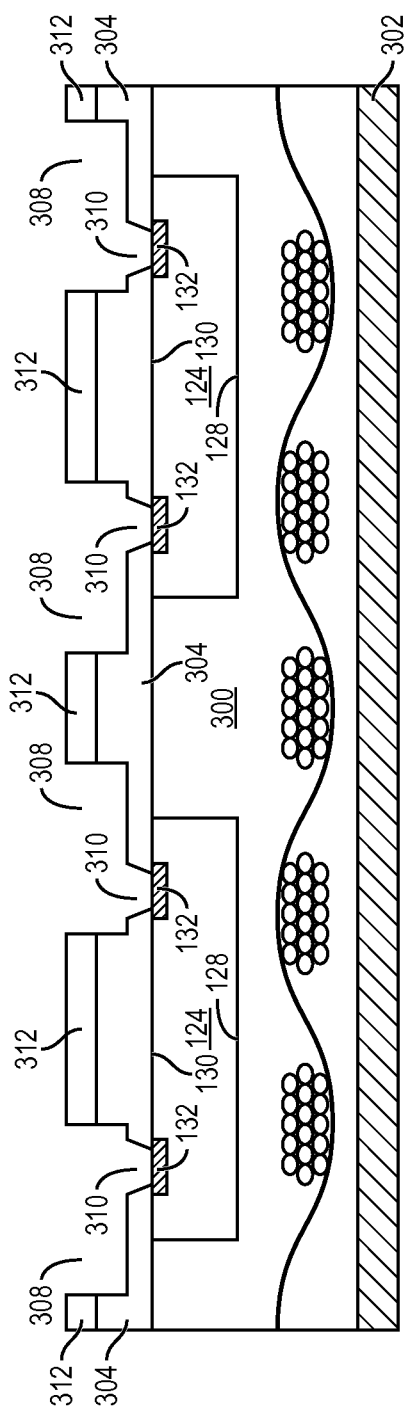

FIGS. 12a-12j illustrate, in relation to FIGS. 1 and 2a-2d a process of forming a build-up interconnect structure over a reconfigured wafer 296 with embedded semiconductor 124. Reconfigured wafer 296 is similar to the reconfigured wafers described in FIG. 4c, 5c, 6c, 7c, 8c, or 9. FIG. 12a shows semiconductor die 124 embedded within insulating film 300. Insulating film 300 is a reinforced laminating insulating film, sheet mold, or layer similar to insulating film 160. Insulating film 300 contains one or more glass fibers, glass fillers, or glass cloth. In some embodiments, insulating film 300 includes epoxy, epoxy resin, polymeric materials, thermoset plastic laminate, or other non-conductive materials. In some embodiments, insulating film 300 is a multi-layered film including a plurality of resin layers, polyester film layers, and polypropylene film layers.

A conductive layer, copper film, or copper foil 302, similar to conductive layer 162, is formed over a surface of insulating film 300 using PVD, CVD, electrolytic plating, electroless plating process, or other suitable metal deposition process. Conductive layer 302 can be one or more layers of Al, Cu, Sn, Ni, Au, Ag, or other suitable electrically conductive material. Alternatively, conductive layer 302 is disposed separately over a temporary transfer film using PVD, CVD, electrolytic plating, electroless plating process, or other suitable metal deposition process. Conductive layer 302 and temporary transfer film is then laminated over a surface of insulating film 300 followed by removal of the temporary transfer film leaving conductive layer 302 disposed on the surface of insulating film 300. In some embodiments, the thickness of conductive layer 302 ranges from 0.10 µm to 5 µm such that conductive layer 302 is a very thin film structure which contributes to the formation of a semiconductor package with reduced thickness. Conductive layer 302 provides additional stiffness and contributes to the structural stability of insulating film 300.

An insulating or passivation layer 304 is formed over active surface 130 and insulating film 300 using PVD, CVD, printing, lamination, spin coating, spray coating, sintering, or thermal oxidation. Insulating layer 304 contains one or more layers of SiO2, Si3N4, SiON, Ta2O5, Al2O3, or other material having similar insulating and structural properties. The smooth surfaces of insulating film 300 facilitate a uniform interface between insulating layer 304 and insulating film 300. Alternatively, insulating layer 304 is a laminated insulating, passivation, dielectric, or epoxy layer, similar to laminating layer 194 and laminated over insulating film 300 similar to the process illustrated in FIGS. 7a-7c. In some embodiments, insulating layer 304 includes multiple layers such as a resist layer.

A portion of insulating layer 304 is removed by an etching process or LDA to form vias 310 and openings 308 and expose contact pads 132 over active surface 130 as shown in FIG. 12b. In some embodiments, vias 310 and openings 308 are formed using mask-based exposure, a stepper, and a large field exposure system.

FIG. 12c shows an insulating or passivation layer 312 is formed over insulating layer 304 using PVD, CVD, printing, lamination, spin coating, spray coating, sintering or thermal oxidation. Insulating layer 312 contains one or more layers of SiO2, Si3N4, SiON, Ta2O5, Al2O3, or other material having similar insulating and structural properties.

Figure 12D:
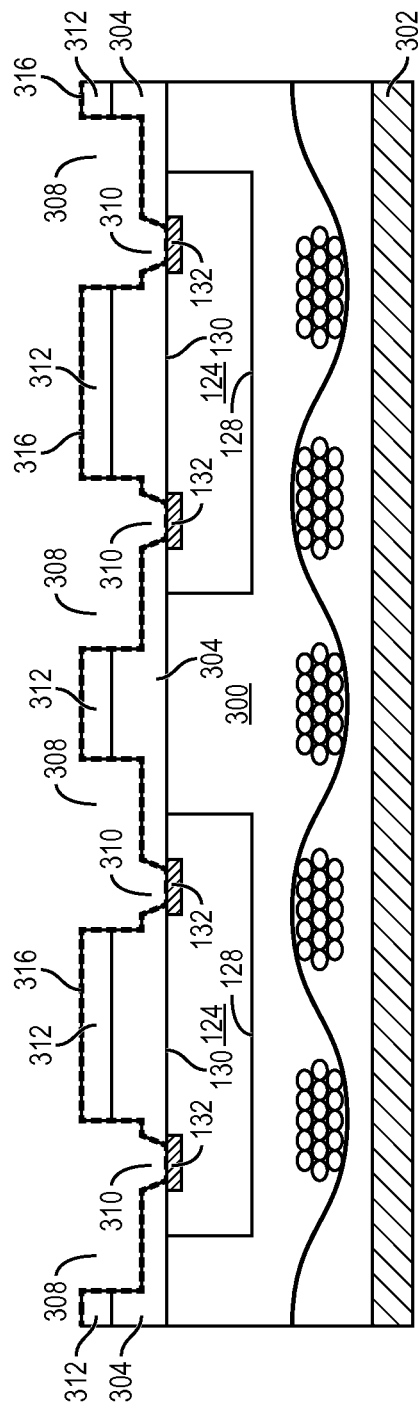

In FIG. 12d, an electrically conductive layer 316 is formed over insulating layer 312 and insulating layer 304 using PVD, CVD, electrolytic plating, electroless plating, or other suitable metal deposition process. Conductive layer 316 contains one or more layers of Al, Cu, Sn, Ni, Au, Ag, or other suitable electrically conductive material. A portion of conductive layer 316 is electrically connected to conductive layer 132 of semiconductor die 124 through vias 310 and openings 308. In some embodiments, conductive layer 316 is conformally applied to and follows the contours of insulating layer 304 and insulating layer 312. In one embodiment, conductive layer 316 operates as an activated trace pattern. In one embodiment, conductive layer 316 includes a UBM over conductive layer 132 having a wetting layer, barrier layer, and adhesive layer.

Figure 12E:
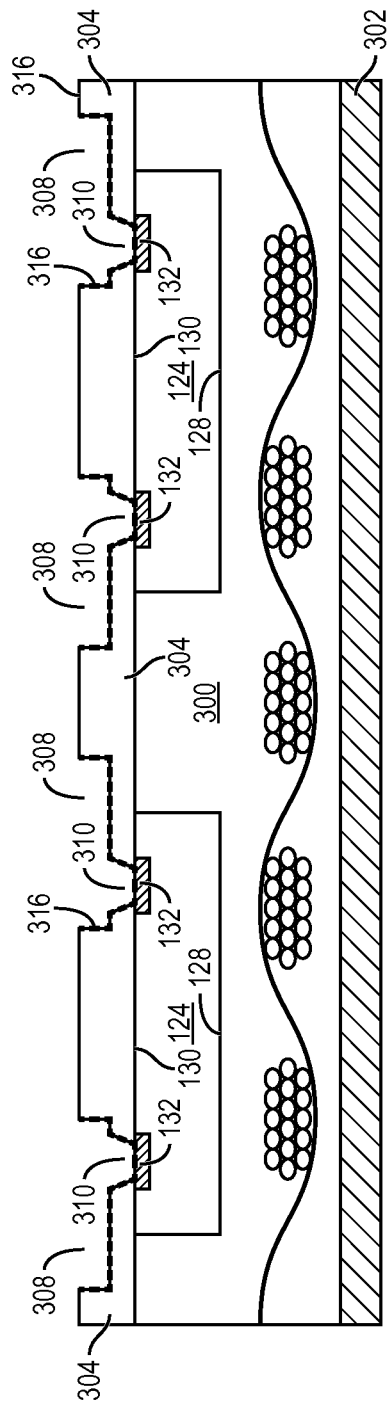

In FIG. 12e, insulating layer 312 and a first portion of conductive layer 316 is removed by an exposure or development process, LDA, etching, or other suitable process. A second portion of conductive layer 316 remaining over insulating layer 304 is an activated trace pattern.

Figure 12F:
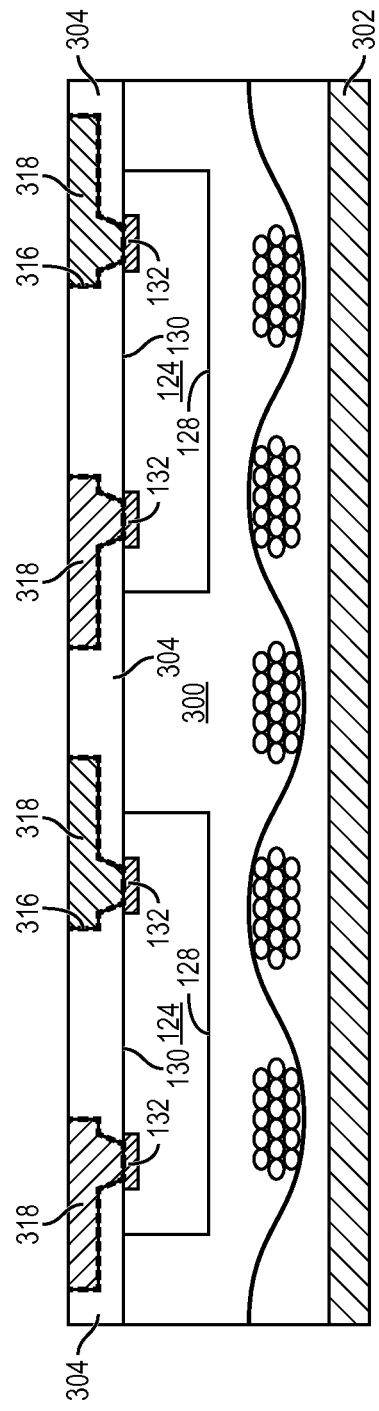

In FIG. 12f, an electrically conductive layer 318 is formed over insulating layer 304 and conductive layer 316 within openings 308 and vias 310 using PVD, CVD, electrolytic plating, electroless plating, or other suitable metal deposition process. Conductive layer 318 contains one or more layers of Al, Cu, Sn, Ni, Au, Ag, or other suitable electrically conductive material. A portion of conductive layer 318 is electrically connected to conductive layer 132 of semiconductor die 124 through conductive layer 316 and vias 310.

Figure 12G:
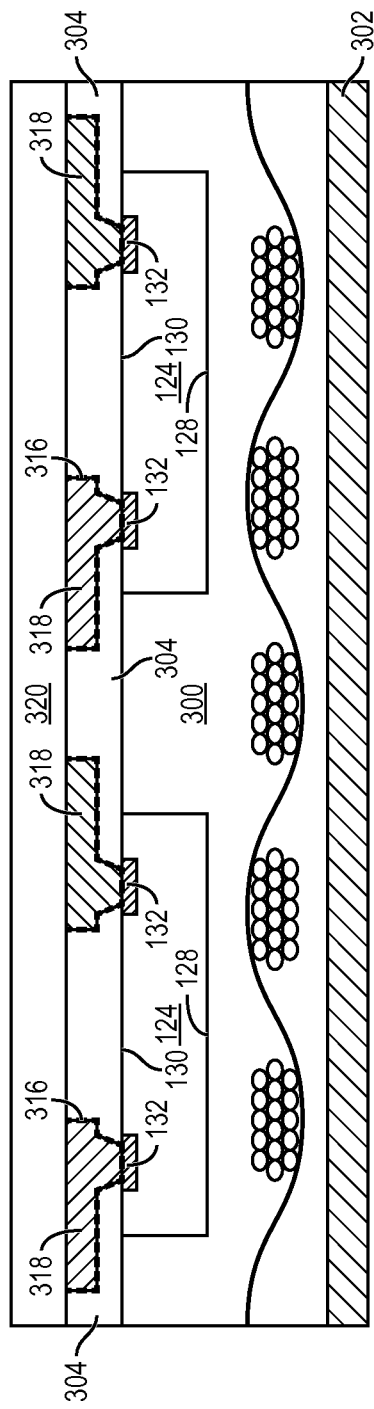
Figure 12H:
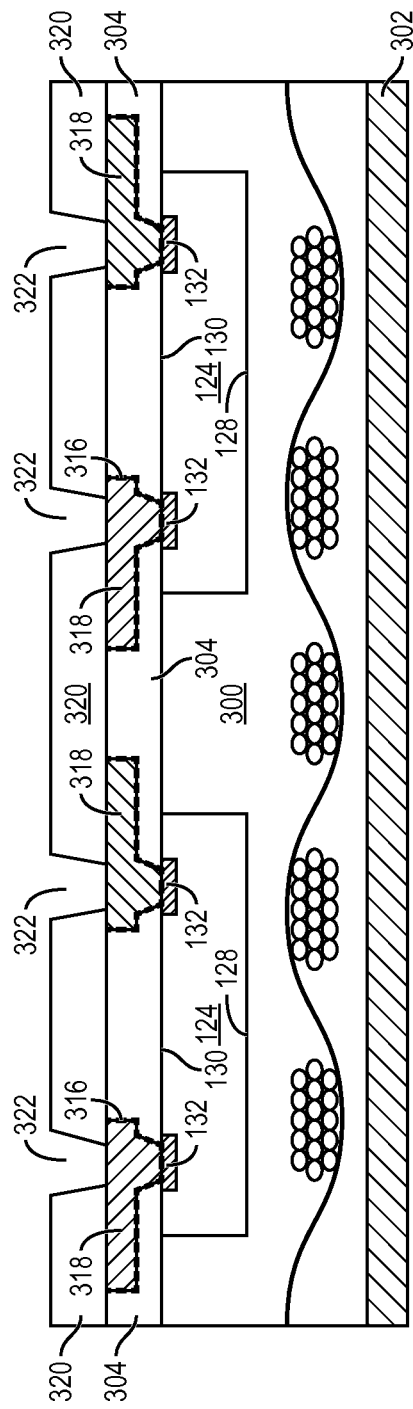

FIG. 12g shows an insulating or passivation layer 320 is formed over insulating layer 304 and conductive layer 318 using PVD, CVD, printing, lamination, spin coating, spray coating, sintering or thermal oxidation. Insulating layer 320 contains one or more layers of SiO2, Si3N4, SiON, Ta2O5, Al2O3, or other material having similar insulating and structural properties. A portion of insulating layer 320 is removed by an etching process or LDA to form openings or vias 322 over portions of conductive layer 318 as shown in FIG. 12h. In some embodiments, vias 322 are formed using mask-based exposure, a stepper, and a large field exposure system.

Figure 12I:
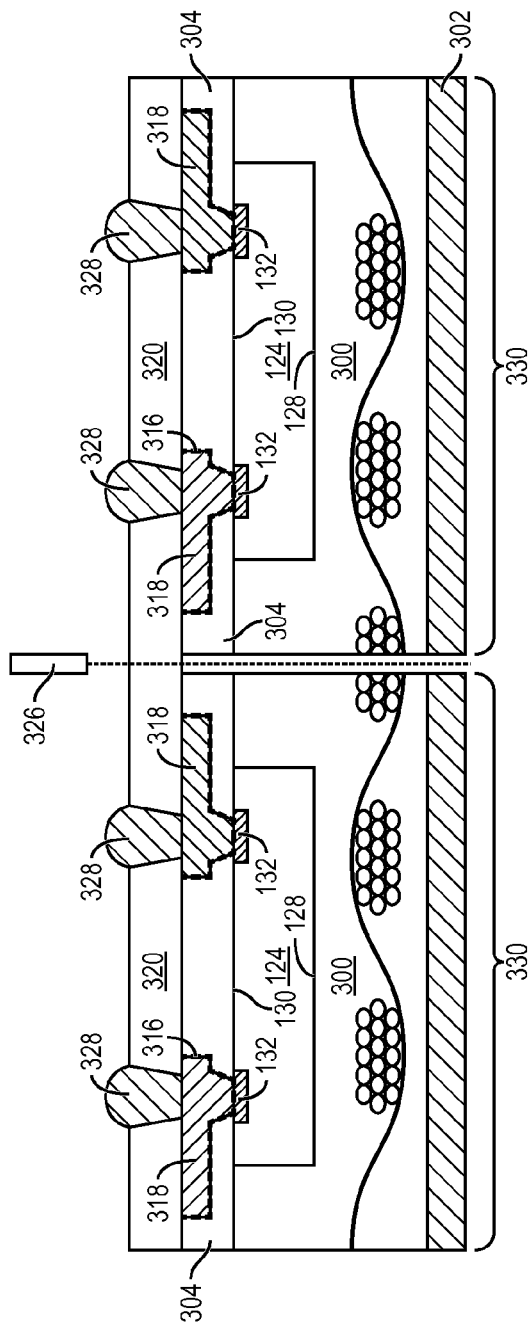

FIG. 12i shows reconstituted wafer 296 is singulated using a saw blade or laser cutting tool 326 into individual semiconductor packages 330. An electrically conductive bump material is deposited within vias 322 over conductive layer 318 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 318 using a suitable attachment or bonding process. In one embodiment, the bump material is reflowed by heating the material above its melting point to form balls or bumps 328. In some applications, bumps 328 are reflowed a second time to improve electrical contact to conductive layer 318. Bumps 328 can also be compression bonded or thermocompression bonded to conductive layer 318. Bumps 328 represent one type of interconnect structure that can be formed over conductive layer 318. The interconnect structure can also use conductive paste, stud bump, micro bump, or other electrical interconnect.

Figure 12J:
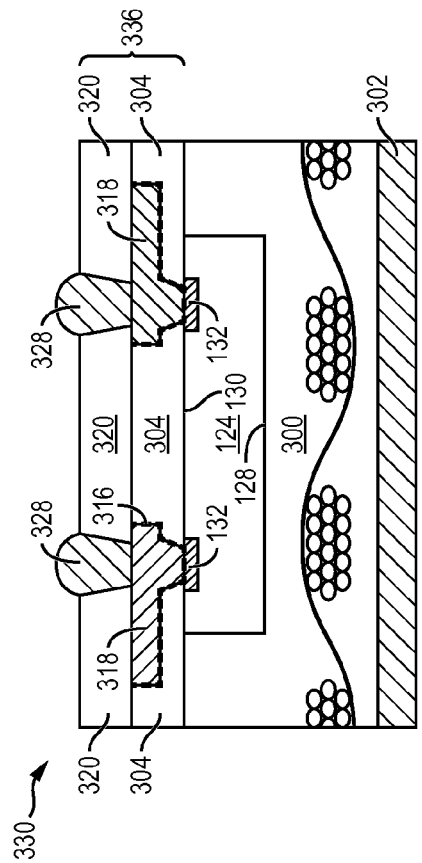

FIG. 12j shows a semiconductor package 330 after singulation from reconstituted wafer 296 with semiconductor die 124 embedded within insulating film 300 and build up interconnect structure 336 formed over active surface 130 of semiconductor die 124. Interconnect structure 336 includes a combination of insulating layer 304, insulating layer 320, conductive layer 316, conductive layer 318, and bumps 328. Interconnect structure 336 over insulating film 300 provides high density wiring patterns which achieve significant performance improvements. Interconnect structure 336 has improved reliability and is efficient for 3D integration and vertical stacking over semiconductor die 124. Further, interconnect structure 336 is a low cost addition to semiconductor package 330.

Insulating film 300 embeds and supports semiconductor die 124 with reduced process steps. Insulating film 300, as a prefabricated component laminated over semiconductor die 124, does not require being formed or built up over the semiconductor die 124. Insulating film 300 reduces process steps because insulating film 300 and additional insulating films similar to insulating film 300 can be processed and applied continuously over semiconductor die 124. Insulating film 300 is not susceptible to complications arising from the application of conventional insulating materials. For example, as a prefabricated structure, insulating film 300 reduces the formation of voids, roughness, and imperfections generated by conventional liquid coating processes. Insulating film 300 reduces the likelihood of warpage in a semiconductor package. Insulating film 300 improves environmental conditions by, e.g., reducing solvent evaporation and the creation of wasteful byproducts typically generated with liquid insulating materials. Insulating film 300 has a reduced CTE, and high insulation reliability. Insulating film 300 reduces shifting of semiconductor die 124 during the formation of interconnect structure 336. Insulating film 300 has advanced adhesive properties and smooth surfaces which facilitates the formation of interconnect structure 336. Insulating film 300, reinforced with glass fibers, glass fillers, or glass cloth, combined with conductive layer 302 is a robust and secure embedding material for semiconductor die 124 and provides enhanced structural stability across the thickness of semiconductor package 330.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a reinforced insulating film;
    disposing a conductive layer on a first surface of the reinforced insulating film;
    disposing a semiconductor die in contact with a second surface of the reinforced insulating film;
    disposing a prefabricated laminating layer over the semiconductor die, wherein the prefabricated laminating layer extends completely over the semiconductor die; and
    laminating the prefabricated laminating layer over the reinforced insulating film by applying pressure to the prefabricated laminating layer against the semiconductor die to embed the semiconductor die in the prefabricated laminating layer and expose an active surface of the semiconductor die from the prefabricated laminating layer opposite the reinforced insulating film, wherein a thickness of the prefabricated laminating layer is approximately equal to a thickness of the semiconductor die across an entire width of the semiconductor device after laminating.

2. The method of claim 1, further including providing the reinforced insulating film to include glass cloth, glass fiber, or glass fillers.

3. The method of claim 1, further including laminating the prefabricated laminating layer over the reinforced insulating film with the semiconductor die extending completely through the prefabricated laminating layer.

4. The method of claim 1, further including disposing an insulating layer on the semiconductor die and prefabricated laminating layer.

5. The method of claim 4, further including removing a portion of the insulating layer using laser direct ablation (LDA) to expose a portion of the semiconductor die through the insulating layer.

6. The method of claim 1, wherein the conductive layer is a copper foil.

7. A method of making a semiconductor device, comprising:
    providing a semiconductor die including an active surface;
    disposing the semiconductor die directly on a reinforced insulating film with the active surface of the semiconductor die oriented away from the reinforced insulating film;
    disposing a prefabricated insulating film extending completely over the semiconductor die opposite the reinforced insulating film; and
    laminating the prefabricated insulating film over the reinforced insulating film to embed the semiconductor die in the prefabricated insulating film with a thickness of the prefabricated insulating film approximately equal to a thickness of the semiconductor die across an entire width of the prefabricated insulating film after laminating.

8. The method of claim 7, wherein laminating the prefabricated insulating film over the reinforced insulating film includes providing a vacuum hot press over the semiconductor die.

9. The method of claim 7, further including laminating the prefabricated laminating layer over the reinforced insulating film with the semiconductor die extending completely through the prefabricated laminating layer.

10. The method of claim 7, further including:
    disposing a conductive layer over the reinforced insulating film; and
    disposing the semiconductor die over the reinforced insulating film opposite the conductive layer.

11. The method of claim 10, wherein the conductive layer is a copper foil.

12. The method of claim 7, wherein laminating the prefabricated insulating film over the reinforced insulating film exposes the semiconductor die from the prefabricated insulating film opposite the reinforced insulating film.

13. The method of claim 12, wherein a surface of the prefabricated insulating film is coplanar with an active surface of the semiconductor die.

14. A method of making a semiconductor device, comprising:
    providing a reinforced insulating film;
    disposing a semiconductor die on the reinforced insulating film;
    disposing a prefabricated insulating film over the semiconductor die and reinforced insulating film; and
    laminating the prefabricated insulating film to the reinforced insulating film to embed the semiconductor die within the prefabricated insulating film, wherein an active surface of the semiconductor die is coplanar with a first surface of the prefabricated insulating film opposite the reinforced insulating film.

15. The method of claim 14, wherein laminating the prefabricated insulating film over the semiconductor die includes providing a vacuum hot press over the semiconductor die.

16. The method of claim 14, further including forming an interconnect structure over the semiconductor die.

17. The method of claim 14, further including forming an under bump metallization layer over the semiconductor die.

18. The method of claim 14, further including forming a redistribution layer over the semiconductor die and prefabricated insulating film.

19. The method of claim 14, wherein, after laminating, a thickness of the prefabricated insulating film is approximately equal to a thickness of the semiconductor die across an entire width of the prefabricated insulating film.

20. The method of claim 14, further including disposing the prefabricated insulating film to extend completely over the semiconductor die.

21. The method of claim 14, wherein a second surface of the semiconductor die opposite the active surface is coplanar with a second surface of the prefabricated insulating film after laminating.

22. The method of claim 21, wherein the second surface of the semiconductor die and second surface of the prefabricated insulating film contact the reinforced insulating film.

23. The method of claim 21, further including singulating the semiconductor device through the first surface of the prefabricated insulating film and the second surface of the prefabricated insulating film.

24. The method of claim 14, further including:
    depositing an insulating layer onto the semiconductor die and prefabricated insulating film; and
    forming an opening through the insulating layer to expose the active surface of the semiconductor die.

* * * * *